(12) United States Patent
Woodruff

(10) Patent No.: US 9,607,842 B1
(45) Date of Patent: Mar. 28, 2017

(54) METHODS OF FORMING METAL SILICIDES

(71) Applicant: ASM IP Holding B.V., Almere (NL)

(72) Inventor: Jacob Huffman Woodruff, Scottsdale, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/873,494

(22) Filed: Oct. 2, 2015

(51) Int. Cl.
*H01L 21/285* (2006.01)
*H01L 21/768* (2006.01)

(52) U.S. Cl.
CPC .. *H01L 21/28518* (2013.01); *H01L 21/28556* (2013.01); *H01L 21/28568* (2013.01); *H01L 21/76889* (2013.01)

(58) Field of Classification Search
CPC ......... H01L 21/28518; H01L 21/76889; H01L 21/28568; H01L 21/28556
See application file for complete search history.

(56) References Cited

U.S. PATENT DOCUMENTS

| | | | |
|---|---|---|---|
| 4,058,430 A | 11/1977 | Suntola et al. |
| 4,210,608 A | 7/1980 | Pinke |
| 4,477,296 A | 10/1984 | Nair |
| 4,521,952 A | 6/1985 | Riseman |
| 4,604,118 A | 8/1986 | Bocko et al. |
| 4,605,947 A | 8/1986 | Price et al. |
| 4,670,110 A | 6/1987 | Withers et al. |
| 4,860,687 A | 8/1989 | Frijlink |
| 4,891,050 A | 1/1990 | Bowers et al. |
| 4,902,551 A | 2/1990 | Nakaso et al. |
| 4,965,656 A | 10/1990 | Koubuchi et al. |
| 4,994,402 A | 2/1991 | Chiu |
| 5,032,233 A | 7/1991 | Yu et al. |
| 5,043,300 A | 8/1991 | Nulman |

(Continued)

FOREIGN PATENT DOCUMENTS

| | | |
|---|---|---|
| DE | 410873 | 8/1923 |
| DE | 10 2008 026 284 | 12/2009 |

(Continued)

OTHER PUBLICATIONS

Aaltonen et al. "Atomic Layer Deposition of Ruthenium Thin Films From Ru(THD)3 and Oxygen," Chem. Vap. Deposition, 10, pp. 215-219, (2004).

(Continued)

*Primary Examiner* — John P Dulka
*Assistant Examiner* — Charles R Peters
(74) *Attorney, Agent, or Firm* — Knobbe, Martens, Olson & Bear LLP

(57) ABSTRACT

A method of forming a metal silicide can include depositing an interface layer on exposed silicon regions of a substrate, where the interface layer includes a silicide forming metal and a non-silicide forming element. The method can include depositing a metal oxide layer over the interface layer, where the metal oxide layer includes a second silicide forming metal. The substrate can be subsequently heated to form the metal silicide beneath the interface layer, using silicon from the exposed silicon regions, the first silicide forming metal of the interface layer and the second silicide forming metal of the metal oxide layer.

22 Claims, 10 Drawing Sheets

(56) References Cited

U.S. PATENT DOCUMENTS

| | | |
|---|---|---|
| 5,084,406 A | 1/1992 | Rhodes et al. |
| 5,094,977 A | 3/1992 | Yu et al. |
| 5,106,454 A | 4/1992 | Allardyce et al. |
| 5,147,819 A | 9/1992 | Yu et al. |
| 5,187,122 A | 2/1993 | Bonis |
| 5,196,360 A | 3/1993 | Doan et al. |
| 5,231,056 A | 7/1993 | Sandhu |
| 5,236,865 A | 8/1993 | Sandhu et al. |
| 5,278,098 A | 1/1994 | Wei et al. |
| 5,341,016 A | 8/1994 | Prall et al. |
| 5,378,641 A | 1/1995 | Cheffings |
| 5,382,333 A | 1/1995 | Ando et al. |
| 5,389,575 A | 2/1995 | Chin et al. |
| 5,391,517 A | 2/1995 | Gelatos et al. |
| 5,453,494 A | 9/1995 | Kirlin et al. |
| 5,480,814 A | 1/1996 | Wuu et al. |
| 5,508,212 A | 4/1996 | Wang et al. |
| 5,637,533 A | 6/1997 | Choi |
| 5,656,519 A | 8/1997 | Mogami |
| 5,656,546 A | 8/1997 | Chen et al. |
| 5,695,810 A | 12/1997 | Dubin et al. |
| 5,711,811 A | 1/1998 | Suntola et al. |
| 5,731,634 A | 3/1998 | Matsuo et al. |
| 5,756,394 A | 5/1998 | Manning |
| 5,820,664 A | 10/1998 | Gardiner et al. |
| 5,856,237 A | 1/1999 | Ku |
| 5,865,365 A | 2/1999 | Nishikawa et al. |
| 5,874,600 A | 2/1999 | Rautenstrauch et al. |
| 5,884,009 A | 3/1999 | Okase |
| 5,888,903 A | 3/1999 | O'Brien et al. |
| 5,916,365 A | 6/1999 | Sherman |
| 5,923,056 A | 7/1999 | Lee et al. |
| 5,939,334 A | 8/1999 | Nguyen et al. |
| 5,945,350 A | 8/1999 | Violette et al. |
| 5,989,672 A | 11/1999 | Hayashi |
| 5,998,048 A | 12/1999 | Jin et al. |
| 6,006,763 A | 12/1999 | Mori et al. |
| 6,006,767 A | 12/1999 | Hecker et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,117,761 A | 9/2000 | Manning |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Kang et al. |
| 6,143,658 A | 11/2000 | Donnelly et al. |
| 6,144,060 A | 11/2000 | Park et al. |
| 6,147,405 A | 11/2000 | Hu |
| 6,171,910 B1 | 1/2001 | Hobbs et al. |
| 6,183,565 B1 | 2/2001 | Granneman et al. |
| 6,203,613 B1 | 3/2001 | Gates et al. |
| 6,268,291 B1 | 7/2001 | Andricacos et al. |
| 6,270,572 B1 | 8/2001 | Kim et al. |
| 6,277,735 B1 | 8/2001 | Matsubara |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman |
| 6,346,151 B1 | 2/2002 | Jiang et al. |
| 6,359,159 B1 | 3/2002 | Welch |
| 6,372,584 B1 | 4/2002 | Yu |
| 6,380,080 B2 | 4/2002 | Visokay |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,455,935 B1 | 9/2002 | Hu |
| 6,464,779 B1 | 10/2002 | Powell et al. |
| 6,468,901 B1 | 10/2002 | Maa et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,524,953 B1 | 2/2003 | Hu |
| 6,534,395 B2 | 3/2003 | Werkhoven et al. |
| 6,541,067 B1 | 4/2003 | Marsh et al. |
| 6,551,399 B1 | 4/2003 | Sneh et al. |
| 6,576,053 B1 | 6/2003 | Kim et al. |
| 6,586,330 B1 | 7/2003 | Ludviksson et al. |
| 6,593,656 B2 | 7/2003 | Ahn et al. |
| 6,602,613 B1 | 8/2003 | Fitzgerald |
| 6,617,173 B1 | 9/2003 | Sneh |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,713,381 B2 | 3/2004 | Barr et al. |
| 6,720,262 B2 | 4/2004 | Koh et al. |
| 6,743,721 B2 | 6/2004 | Lur et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,153,772 B2 | 12/2006 | Granneman et al. |
| 7,183,604 B2 | 2/2007 | Cartier |
| 7,211,509 B1 | 5/2007 | Gopinath et al. |
| 7,220,451 B2 | 5/2007 | Aaltonen et al. |
| 7,220,669 B2 | 5/2007 | Hujanen et al. |
| 7,238,595 B2 | 7/2007 | Brabant et al. |
| 7,241,677 B2 | 7/2007 | Soininen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,279,756 B2 | 10/2007 | Wang et al. |
| 7,300,873 B2 | 11/2007 | Millward |
| 7,329,593 B2 | 2/2008 | Bauer et al. |
| 7,404,985 B2 | 7/2008 | Chang et al. |
| 7,419,903 B2 | 9/2008 | Haukka et al. |
| 7,425,500 B2 | 9/2008 | Metz et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,479,421 B2 | 1/2009 | Kavalieros et al. |

(56) References Cited

U.S. PATENT DOCUMENTS

| | | |
|---|---|---|
| 7,494,927 B2 | 2/2009 | Kostamo et al. |
| 7,541,284 B2 | 6/2009 | Park |
| 7,601,223 B2 | 10/2009 | Lindfors et al. |
| 7,615,480 B2 | 11/2009 | Boyd |
| 7,638,379 B2 | 12/2009 | Cheng et al. |
| 7,655,564 B2 | 2/2010 | Shinriki |
| 7,666,773 B2 | 2/2010 | Huotari et al. |
| 7,691,750 B2 | 4/2010 | Granneman et al. |
| 7,771,533 B2 | 8/2010 | Tois et al. |
| 7,771,534 B2 | 8/2010 | Tois et al. |
| 7,824,492 B2 | 11/2010 | Tois et al. |
| 7,927,942 B2 | 4/2011 | Raaijmakers |
| 7,943,988 B2 | 5/2011 | Pham et al. |
| 8,152,922 B2 | 4/2012 | Schmidt et al. |
| 8,384,209 B2 | 2/2013 | Oikawa et al. |
| 9,129,897 B2 | 9/2015 | Pore et al. |
| 9,379,011 B2 | 6/2016 | Pore et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0064948 A1 | 5/2002 | Saito et al. |
| 2002/0102838 A1 | 8/2002 | Paranjpe et al. |
| 2002/0146513 A1 | 10/2002 | Jin et al. |
| 2002/0173054 A1 | 11/2002 | Kim |
| 2003/0013302 A1 | 1/2003 | Nguyen et al. |
| 2003/0059535 A1 | 3/2003 | Luo et al. |
| 2003/0080363 A1 | 5/2003 | Maruyama et al. |
| 2003/0088116 A1 | 5/2003 | Kawano et al. |
| 2003/0100162 A1 | 5/2003 | Joo |
| 2003/0121608 A1 | 7/2003 | Chen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1 | 1/2004 | Kostamo et al. |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0053496 A1 | 3/2004 | Choi |
| 2004/0082125 A1 | 4/2004 | Hou et al. |
| 2004/0087143 A1 | 5/2004 | Norman et al. |
| 2004/0095792 A1 | 5/2004 | Herrmann et al. |
| 2004/0105934 A1 | 6/2004 | Chang et al. |
| 2004/0118697 A1 | 6/2004 | Wen et al. |
| 2004/0126944 A1 | 7/2004 | Pacheco Rontondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0095781 A1 | 5/2005 | Papa Rao et al. |
| 2005/0098440 A1 | 5/2005 | Kailasam et al. |
| 2005/0118807 A1 | 6/2005 | Kim et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |
| 2005/0238808 A1 | 10/2005 | Gatineau et al. |
| 2005/0266700 A1 | 12/2005 | Jursich et al. |
| 2005/0271812 A1 | 12/2005 | Myo et al. |
| 2006/0013955 A1 | 1/2006 | Senzaki |
| 2006/0019495 A1 | 1/2006 | Marcadal et al. |
| 2006/0035462 A1 | 2/2006 | Millward |
| 2006/0063375 A1 | 3/2006 | Sun et al. |
| 2006/0073276 A1 | 4/2006 | Antonissen |
| 2006/0093848 A1 | 5/2006 | Senkevich et al. |
| 2006/0118968 A1 | 6/2006 | Johnston et al. |
| 2006/0121733 A1 | 6/2006 | Kilpela et al. |
| 2006/0128150 A1 | 6/2006 | Gandikota et al. |
| 2006/0137608 A1 | 6/2006 | Choi et al. |
| 2006/0141155 A1 | 6/2006 | Gordon et al. |
| 2006/0165892 A1 | 7/2006 | Weidman |
| 2006/0177601 A1 | 8/2006 | Park et al. |
| 2006/0211228 A1 | 9/2006 | Matsuda |
| 2006/0216932 A1 | 9/2006 | Kumar et al. |
| 2006/0223300 A1 | 10/2006 | Simka et al. |
| 2006/0263977 A1 | 11/2006 | Kim et al. |
| 2007/0004203 A1 | 1/2007 | Streck et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0059502 A1 | 3/2007 | Wang et al. |
| 2007/0082132 A1 | 4/2007 | Shinriki et al. |
| 2007/0190782 A1 | 8/2007 | Park |
| 2008/0038465 A1 | 2/2008 | Dussarrat |
| 2008/0054472 A1 | 3/2008 | Shinriki et al. |
| 2008/0124484 A1 | 5/2008 | Shinriki et al. |
| 2008/0146042 A1 | 6/2008 | Kostamo et al. |
| 2008/0171436 A1 | 7/2008 | Koh et al. |
| 2008/0171890 A1 | 7/2008 | Kim et al. |
| 2008/0200019 A9 | 8/2008 | Huotari et al. |
| 2008/0206982 A1 | 8/2008 | Suzuki |
| 2008/0206985 A1 | 8/2008 | Kim et al. |
| 2008/0214003 A1 | 9/2008 | Xia |
| 2008/0220606 A1 | 9/2008 | Cabral et al. |
| 2008/0224317 A1 | 9/2008 | Machkaoutsan et al. |
| 2008/0242059 A1 | 10/2008 | McSwiney et al. |
| 2008/0296768 A1 | 12/2008 | Chebiam |
| 2008/0315418 A1 | 12/2008 | Boyd |
| 2008/0318417 A1 | 12/2008 | Shinriki et al. |
| 2009/0068832 A1 | 3/2009 | Haukka et al. |
| 2009/0087339 A1 | 4/2009 | Shinriki |
| 2009/0104777 A1 | 4/2009 | Kim |
| 2009/0155997 A1 | 6/2009 | Shinriki |
| 2009/0163024 A1 | 6/2009 | Kim et al. |
| 2009/0197411 A1 | 8/2009 | Dussarrat et al. |
| 2009/0209101 A1 | 8/2009 | Shinriki et al. |
| 2009/0214767 A1 | 8/2009 | Wang et al. |
| 2009/0294807 A1 | 12/2009 | Yan et al. |
| 2009/0315120 A1 | 12/2009 | Shifren et al. |
| 2010/0055433 A1 | 3/2010 | Shinriki et al. |
| 2010/0099904 A1 | 4/2010 | Dupau et al. |
| 2010/0155859 A1 | 6/2010 | Raaijmakers |
| 2010/0193951 A1 | 8/2010 | Dussarrat et al. |
| 2011/0104906 A1 | 5/2011 | Tois et al. |
| 2011/0143534 A1 | 6/2011 | Carron et al. |
| 2011/0269310 A1 | 11/2011 | Raaijmakers |
| 2012/0058270 A1 | 3/2012 | Winter et al. |
| 2012/0270393 A1 | 10/2012 | Pore et al. |
| 2012/0302055 A1 | 11/2012 | Pore et al. |
| 2012/0329208 A1 | 12/2012 | Pore et al. |
| 2013/0115768 A1* | 5/2013 | Pore .......... H01L 21/76886 438/664 |
| 2014/0065799 A1* | 3/2014 | Ahmed .......... H01L 21/3003 438/477 |

FOREIGN PATENT DOCUMENTS

| | | |
|---|---|---|
| EP | 0 321 067 | 6/1989 |
| EP | 0 469 456 | 7/1991 |
| EP | 0 469 470 | 2/1992 |
| EP | 0 880 168 | 11/1998 |
| EP | 1 688 923 | 8/2006 |
| GB | 368850 | 12/1930 |
| GB | 1518243 | 7/1978 |
| GB | 2 340 508 | 2/2000 |

(56) References Cited

FOREIGN PATENT DOCUMENTS

| | | |
|---|---|---|
| JP | 60-10673 | 1/1994 |
| JP | 1998-340994 | 12/1998 |
| JP | 2003-168738 | 6/2003 |
| KR | 10-2001-0004717 | 1/2001 |
| KR | 10-2001-0004718 | 1/2001 |
| KR | 10-2001-0004719 | 1/2001 |
| KR | 10-2001-096408 | 11/2001 |
| KR | 10-2001-0012889 | 12/2001 |
| KR | 10-2003-0011399 | 2/2003 |
| KR | 10-2005-0103373 | 10/2005 |
| TW | 200625632 | 7/2006 |
| TW | 201007916 | 2/2010 |
| TW | 201013929 | 4/2010 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/09126 | 1/2002 |
| WO | WO 02/09158 | 1/2002 |
| WO | WO 03/023835 | 3/2003 |
| WO | WO 03/040150 | 5/2003 |
| WO | WO 03/056612 | 7/2003 |
| WO | WO 2004/035858 | 4/2004 |
| WO | WO 2006/035281 | 4/2006 |
| WO | WO 2009/146870 | 12/2009 |
| WO | WO 2011/056519 | 5/2011 |
| WO | WO 2012/027357 A2 | 3/2012 |
| WO | WO 2013/006242 | 1/2013 |

OTHER PUBLICATIONS

Aaltonen et al. "Reaction Mechanism Studies on Atomic Layer Deposition of Ruthenium and Platinum," Electrochem. Solid-State Lett., 6 (2003), C130-133.
Aaltonen et al., "ALD of Rhodium Thin Films from Rh (acac)$_3$ and Oxygen," Electrochem. Solid-State Lett. 8 (8): C99-C101 (2005).
Aaltonen et al., "Atomic Layer Deposition of Iridium Thin Films," J. Electrochem. Soc. 151(8): G489-G492 (2004).
Aaltonen et al., "Atomic Layer Deposition of Noble Metal Thin Films," dissertation presented at the University of Helsinki, Helsinki, Finland, 2005.
Aaltonen et al., "Atomic Layer Deposition of Noble Metals: Exploration of the Low Limit of the Deposition Temperature," J. Mat. Res. Soc. 19 (11): 3353-3358 (2004).
Aaltonen et al., "Atomic Layer Deposition of Platinum Thin Films," Chem. Mater. 15: 1924-1928 (2003).
Aaltonen et al., "Ruthenium Thim Film Grown by Atomic Layer Deposition", Chem. Vap. Deposition, 9[1], 45, (2003).
Addison et al., "The Vapour Pressure of Anhydrous Copper Nitrate, and its Molecular Weight in the Vapour State," J. Chem. Soc., pp. 3099-3106 (1958).
Ahmed et al., Rival architectures face off in a bid to keep Moore's Law alive, Transistor Wars—IEEE Spectrum (Retrieved from URL: http://spectrum.ieee.org/semiconductors/devices/transistor-wars/0), Nov. 2011, 5 pages.
Akerman et al., "Identifying Tunneling in Ferromagnetic-Insulator-Ferromagnetic Thin Film Structures," Journal of Magnetism and Magnetic Materials, vol. 240, Nos. 1-3, pp. 86-91, (2002).
Aoyama et al., "Chemical Vapor Deposition of Ru and Its Application in (Ba, Sr) TiO$_3$ Capacitors for Future Dynamic Random Access Memories," Jpn. J. Appl. Phys. 38(43): 2194-2199 (1999).
Aoyama et al., "Ruthenium Films Prepared by Liquid Source Chemical Vapor Deposition Using Bis-(ethylcyclopentadienyl)ruthenium", Jpn. J. Appl. Phys., vol. 38, pp. L 1134-L 1136 (1999).
Arnal et al., Materials and processes for high signal propagation performance and reliable 32 nm node BEOL., 1-4244-1069-X-07, 2007 IEEE, pp. 1-3.

Bahlawane et al., "Alcohol-Assisted CVD of Silver Using Commercially Available Precursors", Chem. Vap. Deposition, 2007, vol. 13, pp. 401-407.
Bahlawane et al., "Catalytically enhanced H2-free CVD of transition metals using commercially available precursors", Surface & Coatings Technology, 2007, vol. 201, pp. 8914-8918.
Bahlawane et al., "Nickel and Nickel-Based Nanoalloy Thin Films from Alcohol-Assisted Chemical Vapor Deposition", Chem. Mater, 2010, vol. 22, pp. 92-100.
Bahlawane et al., "Self-catalyzed chemical vapor deposition method for the growth of device-quality metal thin films", Microelectronic Engineering, 2007, vol. 84, pp. 2481-2485.
Baklanov et al., "Characterization of Cu surface cleaning by hydrogen plasma," Journal Vac. Sci. Technol 19(4): 1201-1211 (2001).
Baliga, J., "New Designs and Materials Tackle 1 Gb Memory Challenge," Semiconductor International, World Wide Web address: semiconductor.net, Nov. 2000.
Basceri, C., "Electrial Dielectric Properties of (Ba,Sr) TiO$_3$ Thin Film Capacitors for Ultra-High Density Dynamic Random Access Memories", Thesis, 1997.
Bobo et al., Spin Dependent Tunneling Junctions with Hard Magnetic Layer Pinning, Journal of Applied Physics, vol. 83. No. 11, pp. 6685-6687, (1998).
Bursky, "Hit Up IEDM for Gigabit and Denser DRAMs and Merged Logic-Memory," Electronic Design, World Wide Web address: planetee.com, Dec. 1, 1998.
Byun et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.
Byun et al., *"Formation of a large grain sized TiN layer using TiN$_x$, the epitaxial continuity at the Al/TiN interface . . . "*, J. Appl. Phys. 78(3), Aug. 1, 1995, pp. 1719-1724.
Byun et al., *"TiN/TiSi$_2$ Formation Using TiN$_x$ Layer and Its Feasibilities in ULSI"*, Jpn. J. Appl. Phys. vol. 35 (1995), pp. 982-986.
Byun et al., *"W as a Bit Line Interconnection in Capacitor-Over-Bit-Line (COB) Structured Dynamic Random Access Memory (DRAM)* and *Feasible Diffusion Barrier Layer"*, Jpn. J. Appl. Phys. vol. 35 (1996), pp. 1086-1089.
Byun, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.
Campbell et al., "Titanium dioxide (TiO2)-based gate insulators," IBM J. Res. Develop., May 1999, pp. 383-392, vol. 43, No. 3.
Chae et al., "Atomic Layer Deposition of Nickel by the Reduction of Preformed Nickel Oxide", Electrochemical and Solid-State Letters, 2002, vol. 5, No. 6, pp. C64-C66.
Chau et al., Advanced CMOS Transistors in the Nanotechnology Era for High-Performance, Low-Power Logic Applications, Proceedings 7$^{th}$ International Conference on Solid State and Integrated Circuits Technology (ICSICT), Beijing, China, Oct. 2004, pp. 26-30.
Daub et al., "Ferromagnetic Nanostructures by Atomic Layer Deposition: From Thin Films towards Core-shell Nanotubes", ECS Transactions, 2007, vol. 11, No. 7, pp. 139-148.
Daughton, World Wide Web nve.com-otherbiz-mram2.pdf "Advanced MRAM Concepts," p. 1-6, (Feb. 7, 2001).
Elers et al, "Film Uniformity in Atomic Layer Deposition", Chemical Layer Deposition 2006, 12, 13-24.
Fereday et al., "Anhydrous Cobalt (III) Nitrate," Chemical Communications, p. 271 (1968).
Fukuzumi et al., "Liner-Supported Cylinder (LSC) Technology to Realize Ru—Ta$_2$O$_5$—Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Gaudet et al., Reaction of thin Ni films with Ge: Phase formation and texture, Journal of Applied Physics, 2006, vol. 100, Issue 3, p. 034306.
Geppert, L., The Amazing Vanishing Transistor Act—Radical changes are in the offing for transistors as their dimensions shrink to a few tens of nanometers, IEEE Spectrum, Oct. 2002, pp. 28-33.

(56) References Cited

OTHER PUBLICATIONS

Guo et al., "Modulation of Schottky Barrier Height for NiSi/Si(110) Diodes Using an Antimony Interlayer", IEEE International, May 8-12, 2011, pp. 1-3.

Hamalainen et al., Atomic Layer Deposition of Platinum Oxide and Metallic Platinum Thin Films from Pt(acac)2 and Ozone, Chem. Mater., 2008, vol. 20, Issue 21, pp. 6840-6846.

Hones et al., "MOCVD of Thin Ruthenium Oxide Films: Properties and Growth Kinetics," Chem. Vap. Deposition 6(4): 193-198 (2000).

Hoyas et al., Growth and characterization of atomic layer deposited WC0.7N0.3 on polymer films, Journal of Applied Physics, Jan. 1, 2004, vol. 95, Issue 1, pp. 381-388.

Hu et al., "In situ rapid thermal oxidation and reduction of copper thin films and their applications in ultralarge scale integration," Journal of The Electrochemical Society 148(12): G669-G675 (2001).

Hur'Yeva et al., "Ruthenium Films Deposited by Liquid-Delivery MOCVD using Bis(ethylcyclopentadienyl)ruthenium with Toulene as the Solvent", Chemical Vapor Deposition, vol. 12, pp. 429-434, (2006).

Imai, Tajuki World Wide Web nikkeibp.asiabiztech.com-nea-200008-tech_108675.html, "100 Gbit-Inch HDD Just Around the Corner," p. 1-6, (Aug. 2000).

Inoue et al., "Low thermal-budget fabrication of sputtered-PZT capacitor on multilevel interconnects for embedded FeRAM," IEEE, IED 2000, 2000, Session 34.

Integrated Circuit Engineering Corporation, Practical Integrated Circuit Fabrication Seminar (1998).

Jin et al., "The interfacial reaction of Ni on (100) Si1-xGex (x=0, 0.25) and (111) Ge", available at: http://dspace.mit.edu/bitstream/handle/1721.1/3724/AMMNS014.pdf?sequence=2, Jan. 2003.

Jung et al., "A Novel Ir—IrO$_2$—Pt—PZT—Pt-IrO$_2$—Ir Capacitor for a Highly Reliable Mega-Scale FRAM," IEEE, IED 2000, Session 34 (2000).

Kadota et al., "Ruthenium Films Deposited under H2 by MOCVD using a Novel Liquid Precursor", Interconnect Technology Conference 2009, IITC 2009, IEEE International, pp. 175-176, Jun. 2009.

Kampen et al., Alternative Source/Drain Contact-Pad Architectures for Contact Resistance Improvement in Decanano-Scaled CMOS Devices, Fraunhofer Institute of Integrated Systems and Device Technology (IISB), ULIS Conference Udine Italy, 2008, p. 1.

Kawaguchi, "MPEG1 Decoder LSI for video CD mPD61012," *NEC Device Technology International*, New Products 5 No. 48, pp. 4-8 (Jan. 1998).

Kawamoto et al., "The Outlook for Semiconductor Processes and Manufacturing Technologies in the 0.1-µm Age," Hitachi Review 48(6): 334-339 (1999).

Kim et al., Atomic Layer Deposition of Ni Thin Films and Application to Area-Selective Deposition, Journal of The Electrochemical Society, 2011, vol. 158, Issue 1, pp. D1-D5.

Knisley et al., "Low Temperature Growth of High Purity, Low Resistivity Copper Films by Atomic Layer Deposition", Chem. Mater, 2011, vol. 23, pp. 4417-4419.

Knoops et al., "Remote Plasma and Thermal ALD of Platinum and Platinum Oxide Films", ECS Transactions, 2008, vol. 16, No. 4, pp. 209-218.

Kuhn, K., Moore's Law past 32nm: Future Challenges in Device Scaling, 13th International Workshop on Computational Electronics, 2009, pp. 1-6.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Kwon et al., "Ruthenium Bottom Electrode Prepared by Electroplating for a High Density DRAM Capacitor," J. Electrochem. Soc. 151(2): C127-C132 (2004).

Kwon et al., Plasma-enhance atomic layer deposition of RuTiN thin films for the applicaiton of copper diffusion barrier, ALD Conference, 2004.

Kwon, et al., "Plasma-enhanced Atomic Layer Deposition of Ruthenium Thin Films", Electrochemical and Solid-State Letters, 7(4), C46-C48 (2004).

Lauwers et al., "Low temperature spike anneal for Ni-silicide formation," Microelectronic Engineering 76, 303-310 (MAM2004, Brussels, Belgium, Mar. 7-10, 2004).

Lavela et al., CoFe2O4 and NiFe2O4 synthesized by sol-gel procedures for their use as anode materials for Li ion batteries, Journal of Power Sources, Oct. 11, 2007, vol. 172, Issue 1, pp. 379-387.

Lavoie et al., "Towards implementation of a nickel silicide process for CMOS technologies", Microelectronic Engineering, 2003, vol. 70, pp. 144-157.

Lee et al., "Electroless CoWP boosts cooper reliability, device performance," Semiconductor International, Jul. 1, 2004, 5 pages.

Lee et al., "Interface Properties of Nickel-silicide Films Deposited by Using Plasma-assisted Atomic Layer Deposition", Journal of the Korea Physical Society, 2009, vol. 55, No. 3, pp. 11-53-1157

Lee et al., "On the Ni—Si phase transformation with/without native oxide", Microelectronic Engineering, 2000, vol. 51-52, pp. 583-594.

Lee et al., "Synthesis of Novel Platinum Precursor and Its Application to Metal Organic Chemical Vapor Deposition of Platinum Thin Films", Bull. Korean Chem. Soc., 2008, vol. 29, No. 8, pp. 1491-1494.

Lim et al., Atomic layer deposition of transition metals, Nature Materials, Nov. 2003, vol. 2, pp. 749-754.

Lou et al., "*The Process Window of a-Si/Ti Bilayer Metallization for an Oxidation-Resistant and Self-Aligned TiSi2 Process*," IEEE Transactions on Electron Devices, vol. 39, No. 8, Aug. 1992, pp. 1835-1843.

Namba et al., PEALD of Ru layer on WNC ALD barrier for Cu-porous low-k, Proceedings of Advanced Metallization Conference 2006, p. 39.

Nayfeh, "Heteroepitaxial Growith of Relaxed Germanium on Silcon", Stanford University, available at: http://cis.stanford.edu/~saraswat/Thesis/Ammar%20Nayfeh%20Thesis.pdf, Jun. 2006.

NEC Device Technology International, "Current state of leading edge ULSI process technology and future trends," No. 48, pp. 4-8 (1998).

Nemouchi et al, "A comparative study of nickel silicides and nickel germanides: Phase formation and kinetics", Microelectronic Engineering 83 (2006) 2101-2106.

Nilsen et al. ,"Thin Film Deposition of Lanthanum Manganite Perovskite by the ALE process," Journal of Materials Chemistry, vol. 9, 1781-1784, (1999).

Notice of Allowance for U.S. Appl. No. 11/254,071 sent Sep. 17, 2008.

Office Action dated Aug. 10, 2006, received in U.S. Appl. No. 10/394,430.

Office Action dated Aug. 20, 2003, received in U.S. Appl. No. 10/300,169.

Office Action dated Dec. 14, 2006, received in U.S. Appl. No. 10/394,430.

Office Action dated Dec. 24, 2003, received in U.S. Appl. No. 10/300,169.

Office Action dated Jun. 11, 2008, received in U.S. Appl. No. 11/179,791.

Office Action dated Sep. 13, 2007, received in U.S. Appl. No. 10/394,430.

Office Action for U.S. Appl. No. 11/182,734, filed Jul. 15, 2005, dated Aug. 21, 2008.

Office Action for U.S. Appl. No. 11/182,734, filed Jul. 15, 2005, dated Dec. 29, 2008.

Office Action for U.S. Appl. No. 11/182,734, dated Mar. 17, 2009.

Office Action dated Dec. 14, 2015 received in Taiwanese Application No. 101114212, filed Apr. 12, 2012 in 15 pages.

Office Action sent Nov. 15, 2007 for U.S. Appl. No. 11/254,071, filed Oct. 18, 2005.

Onda et al., "Hydrogen plasma cleaning a novel process for IC-packaging," Semicon West 97, Packaging Materials Conference, 1997, pp. D-1-D-10.

(56) References Cited

OTHER PUBLICATIONS

Pages et al., "The effect of ramp rate—short process time and partial reactions on cobalt and nickel silicide formation," Proceedings 205th ECS Meeting, May 9-13, 2004, San Antonio TX, USA, p. 174-182.
Pakrad, "Pure Tech: Growth of MR-GMR Head Materials," World Wide Web, Puretechinc.com-tech_papers-tech_papers-4.htm, pp. 1-2, (1999).
Paranjpe et al., Atomic Layer Deposition of AlOx for thin Film Head Gap Applications, Journal of Electrochemical Society, V 148 (9), G465-G471.
Park et al., "Metallorganic Chemical Vapor Deposition of Ru and RuO2 using Ruthenocene Precursor and Oxygen Gas", J. Electrochem. Soc., 147[1], p. 203, (2000).
Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.
Pore et al., Atomic Layer Deposition of Antimony and its Compounds Using Dechlorosilylation Reactions of Tris(triethylsilyl)antimony, Chem. Mater., 2011, vol. 23, Issue 2, pp. 247-254.
Pore et al., "Nickel Silicide for Source-Drain Contacts from ALD NiO Films," ASM ALD Conference (2014) in 22 pages.
Premkumar et al., CVD of Metals Using Alcohols and Metal Acetylacetonates, Part I: Optimization of Process Parameters and Electrical Characterization of Synthesized Films, Chem. Vap. Deposition, 2007, vol. 13, 219-226.
Premkumar et al., CVD of Metals Using Alcohols and Metal Acetylacetonates, Part II: Role of Solvent and Characterization of Metal Films Made by Pulsed Spray Evaporation CVD, Chem. Vap. Deposition, 2007, vol. 13, 227-231.
Premkumar et al., Effect of Solvent on the Growth of Co and $Co_2$ Using Pulsed-Spray Evaporation Chemical Vapor Deposition, Chem. Mater., 2007, vol. 19, 6206-6211.
Ritala et al., "Atomic Layer Deposition," Handbook of Thin Film Materials vol. 1: Deposition and Processing of Thin Films, chapter 2, pp. 103-159 (2002).
Rodriguez et al., Experimental and Theoretical Studies on the Reaction of H2 with NiO: Role of O Vacancies and Mechanism for Oxide Reduction, J. Am. Chem. Soc., 2002, vol. 124, Issue 2, pp. 346-354.
Rodriguez et al., Reduction of CuO in H2: in situ time-resolved XRD studies, Catalysis Letters, Feb. 2003, vol. 85, Issue 3-4, pp. 247-254.
Rooth et al., "Atomic Layer Deposition of Iron Oxide Thin Films and Nanotubes using Ferrocene and Oxygen as Precursors", Chem. Vap. Deposition, 2008, vol. 14, 67-70.
Rossnagel, "The latest on Ru-Cu interconnect technology," Solid State Technology, Feb. 2005, Online, pp. 1-4.
Sakurai et al., "Adsorption of ruthenium tetroxide on metal surfaces," *J. Phys. Chem. American Chemical Society*, vol. 89, pp. 1892-1896 (1985).
Satta et al., "The Removal of Copper Oxides by Ethyl Alcohol Monitored in Situ by Spectroscopic Ellipsometry," Journal of the Electromechanical Society, 150 (5) , pp. 300-306 (2003).
Satyanarayana et al., Nanosized spinel NiFe2O4: A novel material for the detection of liquefied petroleum gas in air, Materials Chemistry and Physics, Sep. 28, 2003, vol. 82, Issue 1, pp. 21-26.
Scheffe et al., "Atomic layer deposition of iron(III) oxide on zirconia nanoparticles in a fluidized bed reactor using ferrocene and oxygen", Thin Solid Films, 2009, vol. 517, pp. 1874-1879.
Schubert, E. F. "Silicon Versus Germanium—A Historical Perspective," Prof. E. F. Schubert Group Seminar, http://www.ecse.rpi.edu/~schubert/Course-Teaching-modules/A027-Silicon-versus-germanium---A-historical-perspective.pdf, downloaded on Sep. 15, 2014.
Shao et al., An alternative low resistance MOL technology with electroplated rhodium as contact plugs for 32nm CMOS and beyond, 1-4244-1070-3-07, 2007 IEEE.

Singer, Peter, "Progress in Copper: A Look Ahead", Semiconductor International, May 1, 2002.
SOI Technology: IMB's Next Advance in Chip Design, 1998.
Solanki et al., "Atomic Layer Deposition of Copper Seed Layers," Electrochemical and Solid-State Letters 3(10): 479-480 (2000).
Sundani et al., "Oral Presentation of Dual Damascene Process," slides, Nov. 19, 1998.
Suntola, "Atomic Layer Epitaxy," Handbook of Crystal Growth, vol. 3, chapter 14, pp. 601-663 (1994).
Thompson et al., Moore's law: the future of Si microelectronics, Materials Today, Jun. 2006, vol. 9, No. 6, pp. 20-25.
Tomitaka et al., Magnetic characterization and self-heating of various magnetic nanoparticles for medical applications, Nanoelectronics Conference (INEC), 2010 3rd International, Jan. 3-8, 2010, pp. 896-897.
Tung et al., Atomic Layer Deposition of Noble Metals: Exploration of the Low Limit of the Deposition Temperature, J Mater. Res., vol. 19, No. 11, p. 3353-3357 (Nov. 2004).
U.S. File History printed Oct. 2, 2012 for U.S. Appl. No. 12/339,672, filed Dec. 19, 2008, entitled "Selective Silicide Process".
U.S. File History printed Oct. 2, 2012 for U.S. Appl. No. 13/084,341, filed Apr. 11, 2011, entitled "Selective Silicide Process".
U.S. File History printed Oct. 2, 2012 for U.S. Appl. No. 13/504,079, filed Sep. 17, 2012, entitled "Synthesis and Use of Precursors for ALD of Group VA Element Containing Thin Films".
Ueno et al. Cleaning of CHF3 plasma-etched SiO2—SiN—Cu via structures using a hydrogen plasma, an oxygen plasma and hexafluoracetylacetone vapors, J. Vac. Sci. Technology B vol. 16, No. 6, pp. 2986-2995 (1998).
Utriainen et al., "Studies of metallic thin film growth in an atomic layer epitaxy reactor using $M(acac)_2$ (M=Ni, Cu, Pt) precursors," Applied Surface Science 157: 151-158 (2000).
Utriainen et al., "Studies of NiO thin film formation by atomic layer epitaxy," Materials Science and Engineering B54: 98-103 (1998).
Van Houtum et al., "*TiSi2 strap formation by Ti-amorphous-Si reaction*," J. Vac. Sci. Technol. B 6(6), Nov./Dec. 1988, pp. 1734-1739.
Wang et al. "Phase Formations in Co/Si, Co/Ge, and Co/Si1-xGex by Solid Phase Reactions". MRS Proceedings, vol. 320; 1993. http://dx.doi.org/10.1557/PROC-320-397.
Wang, Shan X. "Advanced Materials for Extremely High Density Magnetic Recording Heads," Department of Materials Science and Engineering, Department of Electrical Engineering, Stanford University, Stanford, CA 94305-4045, presentation.
Winbond News Release, "Successful development of capacitor technology for next generation memory," World Wide Web address: winbond.com, Dec. 13, 2000.
Won et al., "Conformal CVD-ruthenium process for MIM capacitor in giga-bit DRAMs," IEEE, IED 2000, Session 34 (2000).
Wong et al., International Symposium on VLSI Technology, Systems and applications (VLSI-TSA), Apr. 21-23, 2008, pp. 36-37, Hsinchu, Taiwan.
World Wide web, magahaus.com-tech-westerndigital-shitepapers-gmr_m_-wp.shtml, "GMR Head Technology: Increased Areal Density and Improved Performance Areal Density," pp. 1-4, (Feb. 2000).
World Wide Web, pc.guide.com-ref-hdd-op-heads-techGMR-c.html, "Giant Magnetoresistive (GMR) Heads," pp. 1-4.
World Wide web, semiconductor. net-semiconductor-issues-Issues-1998-feb98-docs-emerging.asp, "GMR Read-Write Heads Yield Data Storage Record," pp. 1-2 (Feb. 1998).
World Wide Web, stoner.leeds.ac.uk-research-gmr.htm, "Giant Magnetoresistance," pp. 1-6.
Xu et al. "A breakthrough in low-k barrier-etch stop films for copper damascene applications," Semiconductor Fabtech, 2000, pp. 239-244, 11th Edition.
Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.
Yang et al., Physical, Electrical, and Relaiability Characterization of Ru for Cu Interconnects, 2006 International Interconnect Technology Conference, pp. 187-190, ISBN 1-4244-0103-8-06, 2006 IEEE.

(56) References Cited

OTHER PUBLICATIONS

Yoon et al., "Development of an RTA process for the enhanced crystallization of amorphous silicon thin film," Electrochemical Society Proceedings Sep. 2000: 337-343 (2000).
Yoon et al., "Investigation of $RuO_2$-incorporated Pt layer as a Bottom Electrode and Diffusion Barrier for High Epsilon Capacitor Applications," Electrochemical and Solid-State Letters 3(8): 373-376 (2000).
Yoon et al., "Tantalum-ruthenium dioxide as a diffusion barrier between Pt bottom electrode and $TiSi_2$ ohmic contact layer for high density capacitors," Journal of Applied Physics 86(5): 2544-2549 (1999).
Yoon et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division-Dielectric Science and Technology Division-High Temperature Materials Division, 2000, Wednesday, May 17, 2000, New Applications of RTP, Co-Chairs: A. Fiory and D.-L Kwong, Time 11:10 ABS#550, Title: Development of RTA Process for the Crystallization of A-Si Thin Film—Y.-G. Yoong, T.-K. Kim, K.-B. Kim J.-Y. Chio, B.-I. Lee, and S.-K. Joo (Seoul National Univ.).
Zhang Qingchun "Germanium MOSFETs with High-k Gate Dielectric and Advanced Source/Drain Structure," National University of Singapore, 2007.
U.S. Appl. No. 12/337,141, filed Dec. 17, 2008, Kim et al.
U.S. Appl. No. 60/976,378, filed Sep. 28, 2007, Shinriki, H.
U.S. Appl. No. 61/178,841, filed May 15, 2009, Hamalainen et al.
U.S. Appl. No. 10/728,126, filed Dec. 3, 2003, Granneman.
U.S. Appl. No. 10/782,727, filed Feb. 18, 2004, Lindfors et al.
U.S. Appl. No. 11/254,071, filed Oct. 18, 2005, Kilpela et al.
U.S. Appl. No. 11/367,177, filed Mar. 3, 2006, Shinriki et al.
U.S. Appl. No. 11/469,828, filed Sep. 1, 2006, Shinriki et al.
U.S. Appl. No. 11/557,891, filed Nov. 8, 2006, Shinriki et al.
U.S. Appl. No. 11/955,275, filed Dec. 12, 2007, Shinriki.
U.S. Appl. No. 11/972,081, filed Jan. 10, 2008, Koh.
U.S. Appl. No. 12/129,345, filed May 29, 2008, Shinriki et al.
U.S. Appl. No. 12/201,434, filed Aug. 29, 2008, Shinriki et al.

\* cited by examiner

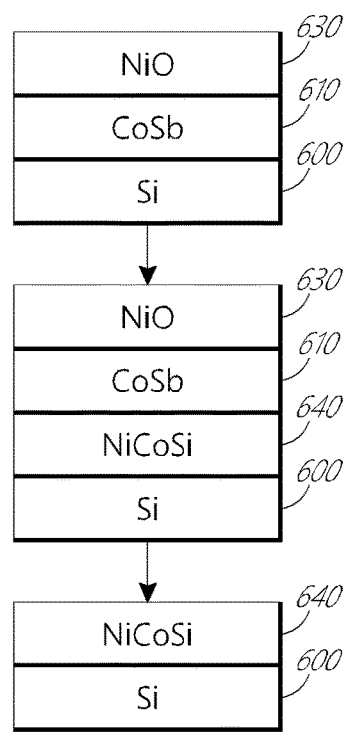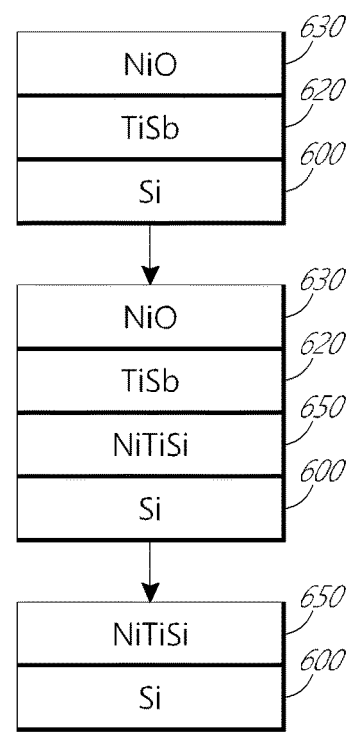
FIG. 6A
FIG. 6B

METHODS OF FORMING METAL SILICIDES

BACKGROUND

Field

The present disclosure relates generally to the field of semiconductor device manufacturing and, more particularly, to methods for forming metal silicides.

Description of the Related Art

Integrated circuit fabrication often includes providing electrical contact to various features of the circuit, such as providing electrical contacts to source, drain and/or gate features of a transistor. Providing reliable and low resistivity electrical contacts to such features can enhance device performance and/or increase production yield.

In forming advanced semiconductor devices, silicon can be converted to metal silicides, for example to provide low-resistivity contacts. Part of the silicon that is present in gate, source and/or drain structures of a semiconductor device can be converted into low-resistivity metal silicide. This is done to realize a conductive path with a low bulk resistivity on the one hand, and to ensure a good contact resistance on the other hand. Metal silicides can be formed on planar and/or three-dimensional structures, for example to provide the low-resistivity contacts.

SUMMARY

In some aspects, a method of forming a metal silicide can include depositing an interface layer on exposed silicon regions of a substrate, the interface layer can include a first silicide forming metal and a non-silicide forming element; depositing a metal oxide layer over the interface layer, where the metal oxide layer comprises a second silicide forming metal; and heating the substrate to form the metal silicide beneath the interface layer. The formed metal silicide may include silicon from the exposed silicon regions and first silicide forming metal from the interface layer and the second silicide forming metal from the metal oxide layer. In some embodiments, the first silicide forming metal is different from the second silicide forming metal.

In some embodiments, the first silicide forming metal can include cobalt (Co), titanium (Ti) or platinum (Pt). In some embodiments, the non-silicide forming element can include antimony (Sb), germanium (Ge) or tin (Sn).

In some embodiments, the second silicide forming metal of the metal oxide layer is nickel and the metal oxide layer is a nickel oxide thin film. In some embodiments, the metal oxide layer can be reduced to form elemental second silicide forming metal.

In some embodiments, the second silicide forming metal of the oxide layer is cobalt, and the metal oxide layer is a cobalt oxide thin film.

In some embodiments, depositing the interface layer can include a plurality of cycles of a vapor deposition process, each cycle of the plurality of cycles including alternately and sequentially contacting the surface of the substrate with a first vapor phase precursor having the first silicide forming metal and a second vapor phase precursor having the non-silicide forming element, where the first vapor phase precursor can react with the second vapor phase precursor to form the interface layer. In some embodiments, the first vapor phase precursor is a metal halide. In some embodiments, the second vapor phase precursor is an antimony containing precursor having the formula $Sb(SiMe_3)_3$.

In some embodiments, depositing the interface layer can include a plurality of super-cycles, each super-cycle comprising a first sub-cycle comprising exposing the substrate to a first vapor phase precursor including the first silicide forming metal and a first reducing agent; and a second sub-cycle comprising exposing the substrate to a second vapor phase precursor including the non-silicide forming element and a second reducing agent. In some embodiments, the first vapor phase precursor can include cobalt, and the first reducing agent can include at least one of hydrogen gas and hydrazine. In some embodiments, the first vapor phase precursor is $tBu\text{-}AllylCo(CO)_3$. In some embodiments, the second vapor phase precursor can include $SbCl_3$, and the second reducing agent can include $Sb(SiR^1R^2R^3)_3$, wherein $R^1$, $R^2$, and $R^3$ are alkyl groups.

In some aspects, a method of forming metal silicide can include depositing an interface layer over at least one exposed silicon region of a substrate, wherein depositing the interface layer can include a plurality of atomic layer deposition cycles, each of the plurality of atomic layer deposition cycles including: contacting a surface of the exposed silicon regions with a first vapor phase precursor having a first silicide forming metal to form a layer of first species on the surface of the substrate; and contacting the first species on the surface of the substrate with a second vapor phase precursor having a non-silicide forming element; depositing a metal oxide layer over the interface layer, wherein the metal oxide layer includes a second silicide forming metal; and forming the metal silicide beneath the interface layer. The formed metal silicide may include silicon of the at least one exposed silicon regions, first silicide forming metal of the interface layer and second silicide forming metal of the metal oxide layer.

In some embodiments, the second silicide forming metal is nickel. In some embodiments, the second silicide forming metal is cobalt.

In some embodiments, the first silicide forming metal includes cobalt (Co), titanium (Ti) or platinum (Pt). In some embodiments, the first vapor phase precursor includes a metal halide. In some embodiments, the first vapor phase precursor includes a metal chloride. In some embodiments, the first vapor phase precursor includes $TiCl_4$ or $CoCl_2$.

In some embodiments, the second vapor phase precursor includes antimony (Sb), germanium (Ge) or tin (Sn). In some embodiments, the second vapor phase precursor has a formula of $Sb(SiR^1R^2R^3)_3$, wherein $R^1$, $R^2$, and $R^3$ are alkyl groups.

For purposes of summarizing the invention and the advantages achieved over the prior art, certain objects and advantages are described herein. Of course, it is to be understood that not necessarily all such objects or advantages need to be achieved in accordance with any particular embodiment. Thus, for example, those skilled in the art will recognize that the invention may be embodied or carried out in a manner that can achieve or optimize one advantage or a group of advantages without necessarily achieving other objects or advantages.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

Various features, aspects, and advantages of the present disclosure are described with reference to the drawings of certain embodiments, which are intended to illustrate certain embodiments and not to limit the invention.

FIGS. 6A and 6B are schematic diagrams of example film stacks corresponding to various steps in processes for forming metal silicides, according to some embodiments.

DETAILED DESCRIPTION

Figure 1:
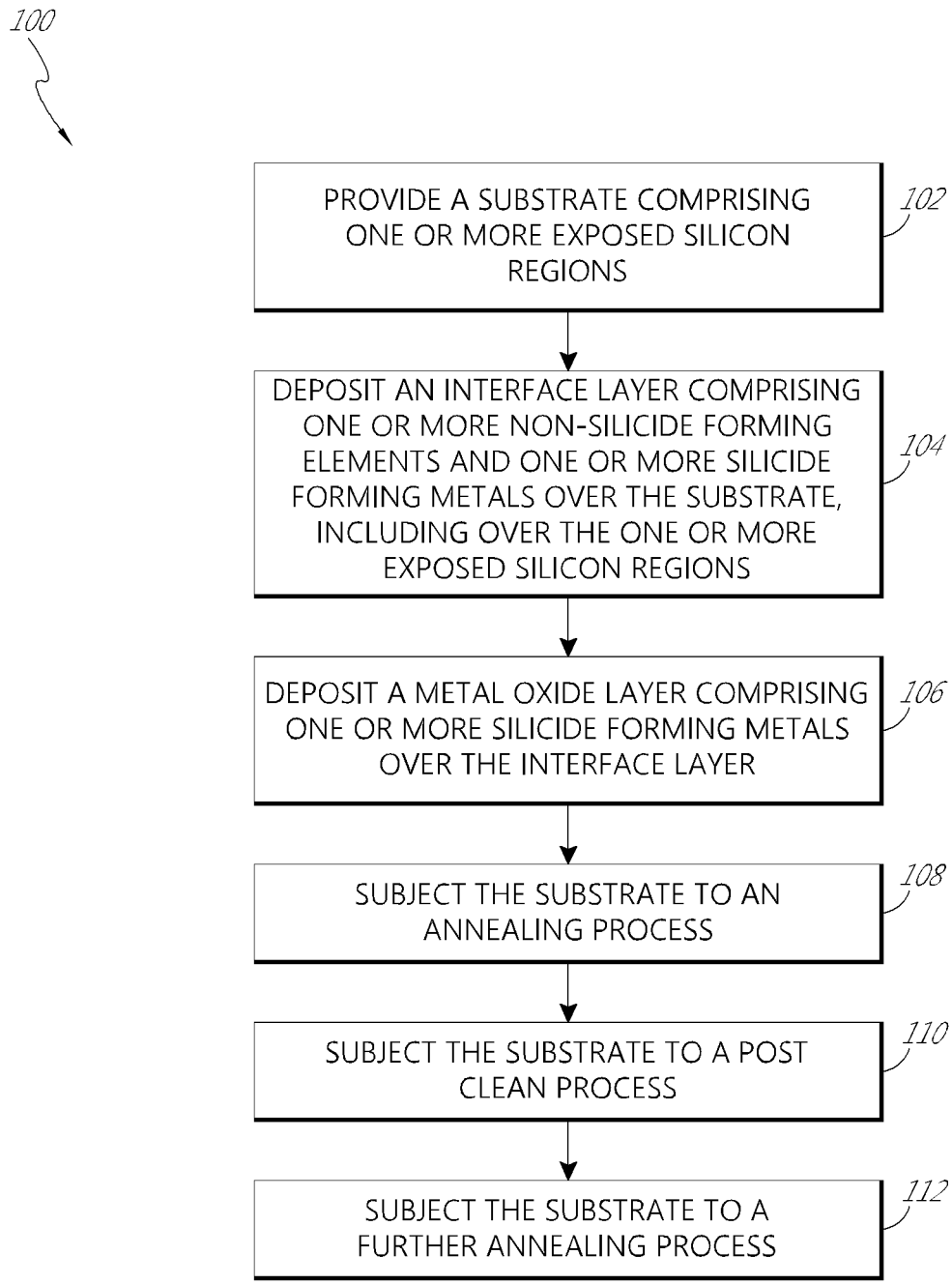
FIG. 1 is a process flow diagram of an example process for forming metal silicide, according to some embodiments.

Processes for forming metal silicide, such as a co-metal silicide, can include forming a sacrificial interface layer over a substrate. The interface layer may be formed over exposed silicon regions of the substrate. In some embodiments, the interface layer can comprise one or more silicide forming metals and one or more non-silicide forming elements. As used herein, a "silicide forming metal" is a metal which reacts with exposed silicon of the substrate to form metal silicide under one or more silicidation process conditions described herein, and a "non-silicide forming element" is an element which does not or substantially does not form metal silicide with exposed silicon of the substrate under conditions of the silicidation processes described herein. In some embodiments, as described in further detail below, during subsequent processing of the substrate, the silicide forming metal of the interface layer can migrate to and react with silicon of exposed silicon regions to form metal silicide beneath the interface layer. Examples of silicide forming metals of the interface layer may include one or more of cobalt (Co), titanium (Ti) and platinum (Pt). Examples of the non-silicide forming element of the interface layer may include one or more of antimony (Sb), germanium (Ge) and tin (Sn).

In some embodiments, a metal oxide layer may be subsequently deposited over the interface layer. The metal oxide layer may comprise a silicide forming metal, including at least one silicide forming metal different from a silicide forming metal of the interface layer. Examples of the silicide forming metal of the metal oxide layer include one or more of nickel (Ni) and cobalt (Co). The substrate may then be heated to facilitate silicidation reaction between the silicon of the exposed silicon regions and the silicide forming metals of the metal oxide layer and the interface layer to form a metal silicide comprising two or more different metals, including a co-metal silicide. For example, the substrate may be heated as part of a thermal annealing process. In some embodiments, the deposited metal oxide may be reduced to provide an elemental form of the silicide forming metal or metals. For example, the elemental form of the silicide forming metal or metals may react with the silicon of the substrate in the subsequent silicidation reaction. In some embodiments, reducing the metal oxide layer and the silicidation reaction may be achieved in a single process, such as part of a single annealing process. In some embodiments, reducing the metal oxide can be performed in a step prior to and distinct from the silicidation reaction step.

As used herein, the formula for metal silicide formed according to one or more processes described herein can be referred to as ABSi for simplicity and convenience. However, the skilled artisan will understand that the actual formula of the metal silicide, representing the A:B:Si ratio in the film and excluding impurities, can be represented as $A_{1-x}B_xSi_y$, where A can be a silicide forming metal from a metal oxide layer, and where B can be a silicide forming metal from a silicide forming metal from an interface layer. In some embodiments, x can be between about 0.05 and about 0.95, and y can be between about 0.5 and about 2. In some embodiments, a ratio of the metal atoms in the silicide to Si atoms can be about 1:1 to about 1:2. For example, a ratio of metal atoms A and B together to Si atoms in the metal silicide can be about 1:1 to about 1:2. In some embodiments, A and/or B can be cobalt (Co), platinum (Pt), titanium (Ti), aluminium (Al) or hafnium (Hf), erbium (Er), ytterbium (Yb), dysprosium (Dy), tungsten (W), molybdenum (Mo), tantalum (Ta), palladium (Pd), zirconium (Zr), yttrium (Y), or Vanadium (V).

In some embodiments, at least a portion of the metal oxide layer and/or elemental metal or metals of the metal oxide remain over the substrate after the silicidation reaction, including over exposed silicon portions of the substrate. For example, unreacted elemental metal or metals from the metal oxide may remain over the substrate, including over exposed silicon portions of the substrate. The non-silicide forming element of the interface layer can remain over the substrate after the silicidation reaction step, including over exposed silicon portions of the substrate. In some embodiments, at least a portion of the one or more silicide forming metals of the interface layer remains after the silicidation reaction, including unreacted silicide forming metals over exposed silicon regions of the substrate. For example, the metal silicide may be formed beneath the interface layer.

In some embodiments, the substrate may be cleaned subsequent to the silicide formation step to remove any remaining interface layer and/or metal oxide layer, including any unreacted metal from the metal oxide layer, while leaving the metal silicide intact. For example, unreacted silicide forming metal of the interface layer and unreacted metal formed by reducing the metal oxide layer, and non-silicide forming element of the interface layer, may be removed by a post clean process. In some embodiments, the post clean process may comprise a metal etch process. For example, the substrate may be dipped in a wet etchant (e.g., a dilute aqueous HCl and/or $HNO_3$ or piranha solution) to selectively remove from the substrate surface any unreacted metal from the metal oxide layer, and the remaining interface layer, including unreacted silicide forming metal of the interface layer and the non-silicide forming element of the interface layer.

As described herein, one or more silicide forming metals may be co-deposited with one or more non-silicide forming elements in a process for forming an interface layer. In some embodiments, use of an interface layer comprising one or more silicide forming metals can advantageously allow use of additional metals in forming metal silicide without using instead additional metal or metal oxide deposition processes. For example, incorporating one or more silicide forming metals into the interface layer, rather than depositing a separate metal or metal oxide thin film comprising the one or more silicide forming metals, can reduce the thermal budget of the process to form the metal silicide. Avoiding additional thermal budget in a device fabrication process can reduce undesired impact upon features of the device due to subsequent deposition processes. In some embodiments, incorporation of a silicide forming metal into the interface layer may allow formation of metal silicide using the metal where an oxide of the metal would otherwise be difficult to reduce. In some embodiments, incorporation of a silicide forming metal into the interface layer may allow formation of metal silicide having desired thermal stability, thereby providing devices with improved reliability. For example, use of interface layers comprising one or more silicide forming metals may facilitate formation of metal silicides comprising more than one type of metal. In some embodiments, such metal silicides comprising more than one type of metal can demonstrate improved thermal stability, such as compared to silicides comprising only one or fewer of the metals. In some embodiments, an electrical contact comprising metal silicides having more than one type of metal can demonstrate improved thermal stability, such as relative to electrical contacts comprising metal silicides comprising fewer types of metal.

In some embodiments, metal silicide can be formed on three-dimensional structures. For example, for certain semiconductor structures, such as a nonplanar multiple gate transistor, such as FinFETs, it may be desirable to form silicide on vertical walls, in addition to the tops of the gate, source, and drain regions. In other semiconductor devices, it may be beneficial to form silicide in narrow openings or trenches. In some embodiments, one or more conformal interface layers described herein may be deposited over one or more three-dimensional structures on a substrate surface such that metal silicide can be formed on the three-dimensional structures using metal from the interface layer. For example, a conformal interface layer may be deposited over the three-dimensional structures, and a conformal metal oxide layer may be deposited over the interface layer. The substrate may be subsequently subjected to an anneal process such that metal silicide can be formed using metal from the interface and metal oxide layers, and silicon from exposed silicon regions on the three-dimensional structures. For example, metal silicide may be formed on one or more vertical surfaces of the three-dimensional structures.

In some embodiments, a process for forming one or both of the interface layer and the metal oxide layer can comprise an atomic layer deposition (ALD) process. In some embodiments, a process for forming one or both of the interface layer and the metal oxide layer can comprise a chemical vapor deposition (CVD) process. Atomic layer deposition (ALD) and/or chemical vapour deposition (CVD) processes can be used to form conformal layers over three-dimensional structures. Conformal and/or uniform formation of layers over three-dimensional structures can provide metal silicide of desired resistivity across structures on the surface of the substrate, for example reducing variation in resistivity across the structures on the surface of a substrate, thereby providing uniform electrical performance of electrical devices formed using the metal silicide.

The metal silicide forming process can be a self-aligned process. Self-aligned silicidation is also known in the art as "salicidation" and the self-aligned resultant metal compound has been referred to as "salicide." In a self-aligned process, metal silicide forms only where both silicon and silicide forming metal are present. For example, a portion of the interface layer can be formed on and in direct contact with the exposed silicon of the substrate. In a self-aligned silicidation process, metal silicide can be formed only or substantially only in the exposed silicon region in direct contact with the interface layer.

In some embodiments, an ALD process can be used to form an interface layer comprising antimony and cobalt over a substrate. In some embodiments the interface layer is formed over exposed silicon regions of the substrate. For example, the interface layer is formed on and in direct contact with the exposed silicon regions of the substrate. A metal oxide layer can be deposited over the interface layer. For example, the metal oxide layer may be a nickel oxide (e.g., NiO) layer, and the nickel oxide layer may be deposited on and in direct contact with the interface layer comprising the antimony and cobalt. In some embodiments, an ALD process can be used to deposit the metal oxide layer. The substrate may then be subjected to a silicidation process to form a metal silicide using silicon from the exposed silicon regions, nickel from the nickel oxide layer, and cobalt from the interface layer. In some embodiments, the metal oxide layer may be reduced to form elemental metal. For example, the nickel oxide layer may be reduced to form elemental nickel, and the elemental metal reacts with silicon of the substrate to form the metal silicide. In some embodiments, reducing the metal oxide layer and the silicidation process can be a single process, such as a single annealing process.

Antimony of the interface layer can remain over the substrate after the silicidation reaction, including over exposed silicon regions of the substrate. In some embodiments, unreacted cobalt of the interface layer can remain over the substrate after the silicidation reaction. For example, a portion of the interface layer cobalt may remain over exposed silicon regions of the substrate. In some embodiments, unreacted elemental nickel from the nickel oxide and/or unreduced nickel oxide can remain over the substrate after the silicidation reaction, including over exposed silicon regions of the substrate. For example, NiCoSi may be formed beneath the remaining interface layer.

In some embodiments, the interface layer comprises antimony and titanium and the metal oxide layer is a nickel oxide layer such that NiTiSi is formed. For example, the antimony and titanium interface layer may be deposited over a substrate, followed by deposition of the nickel oxide layer over the antimony and titanium interface layer. The substrate may be subjected to a silicidation process such that NiTiSi can be formed using silicon from the exposed silicon regions, nickel from the nickel oxide layer and titanium from the interface layer. In some embodiments, the nickel oxide may be reduced to form elemental nickel such that the elemental nickel reacts with the silicon during the silicidation reaction. Unreacted elemental nickel and/or unreduced nickel oxide can remain on the substrate after the silicidation reaction. In some embodiments, antimony and unreacted titanium from the interface layer can remain on the substrate after the silicidation reaction. For example, the NiTiSi may be formed beneath the remaining interface layer.

In some embodiments, the metal oxide layer is cobalt oxide (e.g., CoO) layer and the interface layer comprises platinum. For example, the interface layer may comprise antimony and platinum such that CoPtSi is formed. In some embodiments, the interface layer comprises antimony and nickel such that CoNiSi is formed. In some embodiments, the interface layer comprises antimony and tungsten such that CoWSi is formed. In some embodiments, forming a cobalt-containing silicide comprising one or more of platinum, nickel and tungsten can allow formation of cobalt-containing silicides having desired thermal stability.

FIG. 1 shows an example process 100 for forming metal silicide, according to some embodiments. In some embodiments, the process 100 comprises a self-aligned silicidation process. In block 102, a substrate comprising one or more exposed silicon regions is provided. In some embodiments, the substrate can have three-dimensional structures formed thereon. In some embodiments, the three-dimensional structures comprise one or more exposed silicon regions. For example, the one or more of the exposed silicon region may be on a vertical surface of the substrate.

In block 104, an interface layer comprising one or more non-silicide forming elements and one or more silicide forming metals can be deposited over the substrate, including over the one or more exposed silicon regions. In some embodiments, the interface layer can be deposited on and in direct contact with one or more exposed silicon regions. In some embodiments, the interface layer can be a thin film configured to prevent or substantially prevent oxidation of the underlying exposed silicon regions during subsequent processing of the substrate. Desirably, the deposition of the interface layer also does not induce oxidation of the underlying silicon. Oxidation of the underlying silicon can inhibit metal diffusion, and therefore silicide formation. In some embodiments, the interface layer protects the silicon from oxidation during subsequent deposition of metal oxide, while also permitting ready migration of metal and/or silicon across the interface between the interface layer and the underlying silicon, without undue energy injection. Undue energy can be such as destroys integrated circuit structures, such as transistor junctions.

In some embodiments, the one or more non-silicide forming elements and the one or more silicide forming metals can be co-deposited. For example, the non-silicide forming elements and silicide forming metals may be deposited in the same deposition process. As described in further detail herein, in some embodiments, a process for depositing the interface layer can include an ALD process and/or a CVD process. For example, the one or more silicide forming metals and the one or more non-silicide forming elements of the interface layer can be deposited as part of the same ALD process, forming an interface layer comprising two or more metals. For example, a conformal interface layer can be deposited over three-dimensional features on the substrate using an ALD process and/or a CVD process. In some embodiments, the interface layer can have a thickness of about 1 nanometers (nm) to about 15 nm. In some embodiments, the interface layer can have a thickness of about 1 mm to about 15 nm, about 1 nm to about 10 nm, about 5 nm to about 15 nm, or about 1 nm to about 5 nm. In some embodiments, the interface layer can have a thickness of about 4 nm to about 15 nm. In some embodiments, the thickness of the interface layer can be selected based on the desired thickness of silicide to be formed. In some embodiments, the thickness of the interface layer can be selected to provide desired protection of the underlying silicon, while allowing desired diffusion of silicon and/or silicide forming metals therewithin, demonstrating desired thickness uniformity and/or providing a desired quantity of silicide forming metal for the silicide.

In some embodiments, the interface layer comprises a semimetal as a non-silicide forming element. In some embodiments, the interface layer comprise antimony (Sb) as a non-silicide forming element. In some embodiments, the interface layer comprises tin (Sn) and/or germanium (Ge) as a non-silicide forming element. In some embodiments, the one or more silicide forming metals of the interface layer comprise cobalt (Co). In some embodiments, the one or more silicide forming metals comprises platinum (Pt), titanium (Ti), aluminium (Al) and/or hafnium (Hf). In some embodiments, the one or more silicide-forming metals can comprise one or more of erbium (Er), ytterbium (Yb) and dysprosium (Dy). In some embodiments, the one or more silicide forming metals comprise tungsten (W), molybdenum (Mo), tantalum (Ta) and/or palladium (Pd). In some embodiments, the one or more silicide forming metals comprise zirconium (Zr), yttrium (Y), and/or Vanadium (V). In some embodiments, the one or more non-silicide forming elements comprise bismuth (Bi), indium (In), zinc (Zn), and/or lead (Pb).

In block 106, a metal oxide layer is deposited over the interface layer. In some embodiments, a process for depositing the metal oxide layer can comprise an ALD and/or a CVD process. For example, a conformal metal oxide layer may be deposited over three-dimensional features on a substrate using an ALD process and/or a CVD process. As described herein, the metal oxide layer can comprise one or more silicide forming metals. In some embodiments, the metal oxide layer is a nickel oxide thin film (e.g., NiO thin film) and the silicide forming metal of the metal oxide layer is nickel. For example, a nickel oxide thin film can be deposited on and in direct contact with the interface layer. In some embodiments, the metal oxide layer is a cobalt oxide thin film (e.g., CoO thin film) and the silicide forming metal of the metal oxide layer is cobalt. For example, a cobalt oxide thin film can be deposited on and in direct contact with the interface layer. The metal oxide layer can have a thickness of about 1 nm to about 20 nm, including about 2 nm to about 5 nm, or about 5 nm to about 15 nm. In some embodiments, the metal oxide layer can have a thickness of about 1 nm to about 10 nm. In some embodiments, the thickness of the metal oxide layer can be selected based on the desired thickness of the silicide formed. In some embodiments, the thickness of the metal oxide layer can be selected based on the thickness of the interface layer, the amount of metal provided by the metal oxide layer, such as the amount of metal available for silicide formation after reducing the metal oxide layer, and/or the desired amount of metal used for forming the metal silicide.

In block 108, the substrate can be subjected to an annealing process. In some embodiments, the annealing process allows formation of the metal silicide. For example, conditions of the annealing process may be selected such that metal silicide is formed from silicon of the exposed silicon regions, the one or more silicide forming metals of the metal oxide layer and the one or more silicide forming metal of the interface layer. For example, a metal silicide comprising a metal from the metal oxide layer and a metal from the interface layer may be formed. In some embodiments, the annealing process is configured to both reduce the metal oxide of the metal oxide layer to form elemental metal and provide desired metal silicide formation from the exposed silicon regions of the substrate. For example, conditions of the annealing process in block 108 can be selected such that desired reduction of the metal oxide layer can be achieved, while also providing desired migration of the elemental metal formed from the metal oxide layer, of the one or more silicide forming metals from the interface layer, and/or migration of silicon from the exposed silicon regions. Conditions of the annealing process can be selected such that desired metal silicide comprising silicon from the exposed silicon regions, the one or more elemental metals formed from the metal oxide layer and the one or more silicide forming metals of the interface layer, can be formed.

In some embodiments, the annealing process can be performed at temperatures equal to or greater than about 250° C., equal to or greater than about 300° C., equal to or greater than about 350° C., equal to or greater than about 400° C., or even equal to or greater than about 500° C. In some embodiments, the annealing process can be performed in a moderately reducing atmosphere, such as hydrogen gas ($H_2$) or hydrogen and nitrogen gas (forming gas or $H_2/N_2$). In some embodiments, reduction and silicidation can be induced by annealing at about 550° C. in forming gas (5% $H_2$ and 95% $N_2$), such as for a duration of about 2 minutes.

In some embodiments, the metal oxide layer comprises nickel oxide and the interface layer comprises cobalt (e.g., the interface layer can be a CoSb thin film) such that NiCoSi is formed by the annealing process. For example, the CoSb interface layer may be deposited over a substrate, including over exposed silicon regions of the substrate, and the nickel oxide layer may be deposited over the CoSb layer, such that the NiCoSi may be formed from silicon of the exposed silicon regions, cobalt of the CoSb layer and nickel of the nickel oxide layer when the substrate is exposed to an annealing process. In some embodiments, the metal oxide layer comprises nickel oxide and the interface layer comprises titanium (e.g., the interface layer can be a TiSb thin film) such that the annealing process forms NiTiSi. In some embodiments, the metal oxide layer comprises nickel oxide and the interface layer comprises platinum (e.g., the interface layer can be a PtSb thin film) such that the annealing process forms NiPtSi. As described in further details herein, other metal silicides can also be formed from other combinations of metal oxide and interface layer compositions.

In block 110, the substrate can be subjected to a post clean process. In some embodiments, the post clean process can be configured to remove any remaining interface layer and/or metal oxide layer on the substrate surface. For example, the one or more non-silicide forming elements of the interface layer may remain over the substrate. In some embodiments, unreacted silicide forming metal of the interface layer can remain over the substrate, including over exposed silicon regions of the substrate. In some embodiments, metal oxide and/or elemental metal from the metal oxide layer may remain over the substrate, including unreacted elemental metal over exposed silicon regions. Unreacted elemental metal remaining after the silicidation reaction may include elemental metal formed over regions of the substrate where exposed silicon regions of the substrate are not accessible, and may be removed in the post clean process. In some embodiments, the post clean process can be configured to remove any remaining metal oxide layer, unreacted elemental metal, such as unreacted elemental metal from the metal oxide layer, and/or any remaining interface layer. In some embodiments, the post clean process can comprise a wet metal etch. For example, the wet metal etch can selectively remove unreacted metal from the substrate surface. In some embodiments, the wet metal etch process can include dipping the substrate in dilute aqueous HCl and/or $HNO_3$ or piranha solution, to selectively etch the metal. For example, metal, such as nickel, on the substrate can be etched without or substantially without appreciable attack of silicon, silicon oxide and/or other non-metal materials used in integrated circuit manufacture.

In block 112, the substrate can be optionally subjected to a further annealing process. The further annealing process can reduce resistivity of the metal silicide formed in block 108. For example, a high resistivity phase of metal silicide formed by the silicidation reaction in block 108 can be subjected to a further annealing process to form a lower resistivity phase of the metal silicide.

Figure 2:
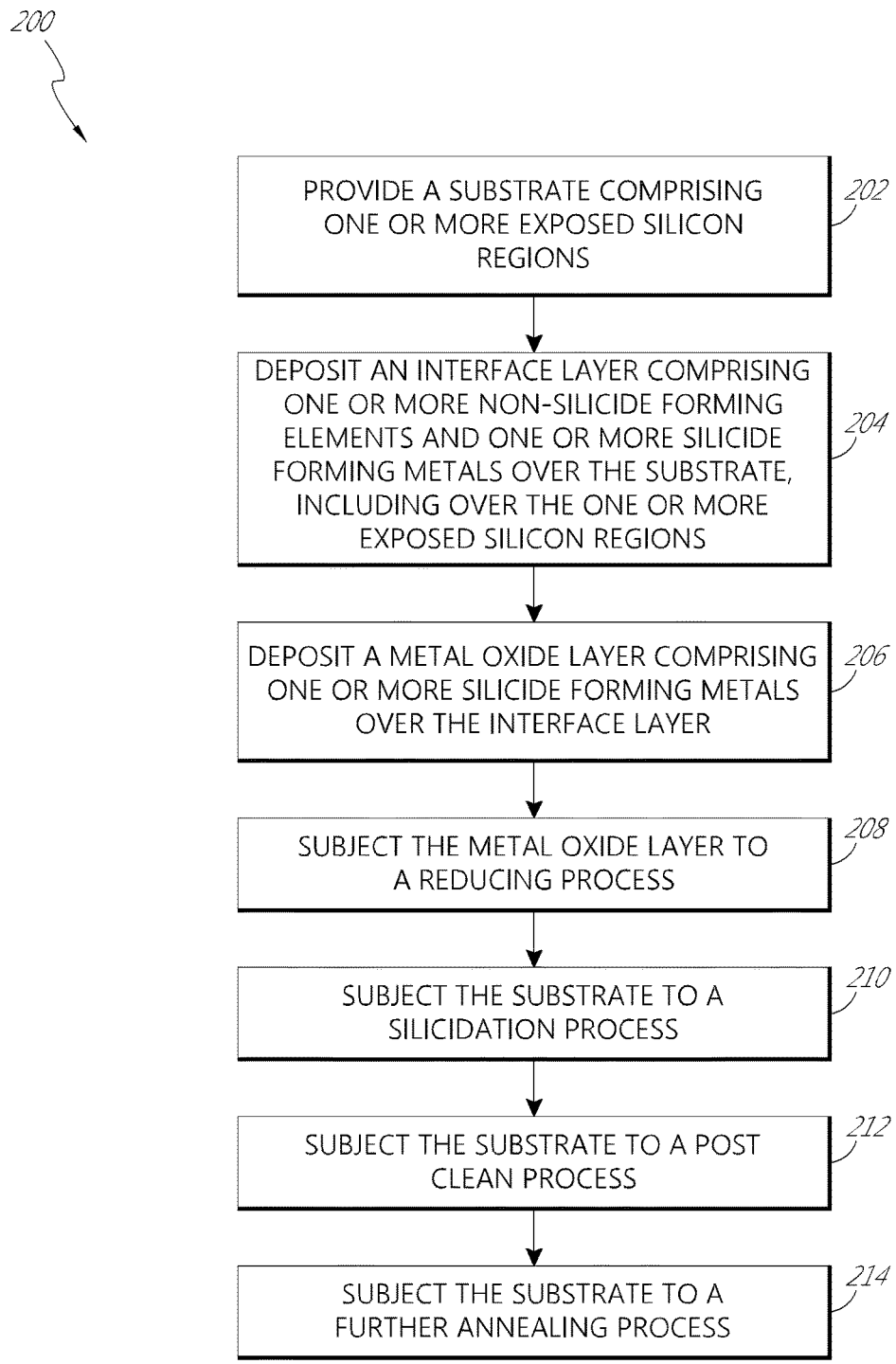
FIG. 2 is a process flow diagram of another example process for forming metal silicide, according to some embodiments.

Referring to FIG. 2, another example of a process 200 for forming metal silicide is shown. The process 200 of FIG. 2 includes steps similar to those of process 100 in FIG. 1, except that process 200 includes a reducing step distinct from a step in which desired silicidation is achieved. Referring to block 202, a substrate comprising one or more exposed silicon regions can be provided. In block 204, an interface layer comprising one or more non-silicide forming elements and one or more silicide forming metals can be deposited over the substrate, including over the one or more exposed silicon regions. In block 206, a metal oxide layer can be deposited over the interface layer. In some embodiments, the substrate of block 202, the deposition of the interface layer in block 204, and the deposition of the metal oxide layer in block 206 can have one or more characteristics of the substrate, the metal oxide deposition and the interface layer deposition described with reference to blocks 102, 104 and 106 in FIG. 1, respectively. For example, a conformal metal oxide layer and/or a conformal interface layer may be deposited. In some embodiments, the conformal metal oxide layer and/or the conformal interface layer may be deposited using an ALD process and/or a CVD process.

In block 208, the metal oxide layer can be subjected to a reducing process. As described herein, the reducing process of block 208 is distinct from a silicide formation process in which desired metal silicide is formed from the exposed silicon regions of the substrate. In some embodiments, conditions of the reducing process can be selected such that the metal oxide can be reduced to provide the desired elemental metal without or substantially without effecting any metal silicide formation. In some embodiments, the reducing process achieves no or substantially no silicidation of the exposed silicon regions of the substrate. In some embodiments, the reducing process can achieve some silicidation of the exposed silicon regions of the substrate but does not complete desired silicide formation of the exposed silicon regions.

In some embodiments, a process for reducing the metal oxide layer, which is distinct and separate from the process for achieving the silicidation reaction, can be accomplished at relatively lower temperatures than a reducing process also configured to achieve desired silicidation. For example, a reducing process which is distinct from a silicidation reaction, such as the reducing process of block 208, can be performed between room temperature (e.g., about 20° C. to about 25° C.) and about 300° C. In some embodiments, a reducing process which is distinct from a silicidation reaction can be performed with relatively stronger reducing agents, such as reducing agents comprising hydrogen containing plasma, hydrogen radicals or hydrogen atoms and reactive organic compounds, which contain at least one functional group selected from the group of alcohol (—OH), aldehyde (—CHO), and carboxylic acid (—COOH).

In block 210, the substrate can be subjected to a silicidation process. Desired silicide formation from the exposed silicon regions and the silicide forming metals of the metal oxide layer and interface layer can be achieved in block 210. In some embodiments, the silicidation process of block 210 comprises a rapid thermal anneal process tailored for silicidation reaction between the already-formed metal layer, silicide forming metal of the interface layer, and the exposed silicon. In some embodiments, the silicide formation in block 210 can be achieved at temperatures higher than that applied in the reducing process of block 208. For example, the silicidation process can be performed at temperatures greater than about 400° C.

In block 212, the substrate can be subjected to a post clean process, and in block 214, the substrate can be subjected to a further annealing process. The post clean process of block 212 and the further annealing process of block 214 can have one or more characteristics of the post clean process and further annealing process of blocks 210 and 212 in FIG. 1, respectively.

Figure 3A:
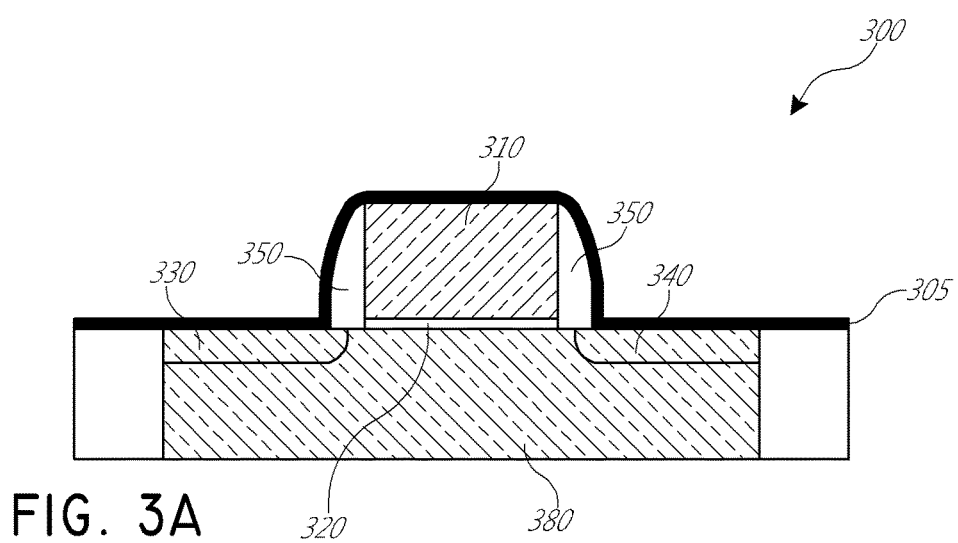
FIGS. 3A through 3C are a series of schematic cross-sections of a planar transistor, illustrating silicidation of source/drain and gate regions in accordance with some embodiments.

With reference to FIG. 3A, a planar transistor 300 is shown after formation of an interface layer 305. The interface layer 305 can be formed as described above with respect to block 104 of FIG. 1 or 204 of FIG. 2. The interface layer may be formed by ALD of a suitable film for the functions described herein, such as an antimony (Sb) containing film. The transistor 300 is formed within and on a substrate 380 and includes a gate electrode 310 over a gate dielectric 320. The gate dielectric 320 overlies a transistor channel, which is sandwiched between heavily doped source region 330 and drain region 340. The gate electrode 10 is protected by dielectric sidewall spacers 350, which can facilitate self-aligned source/drain doping as well as partially self-aligned contact formation. Field isolation 355 (e.g., shallow trench isolation) is also shown for electrical isolation of the transistor 300 from adjacent devices.

Figure 3B:
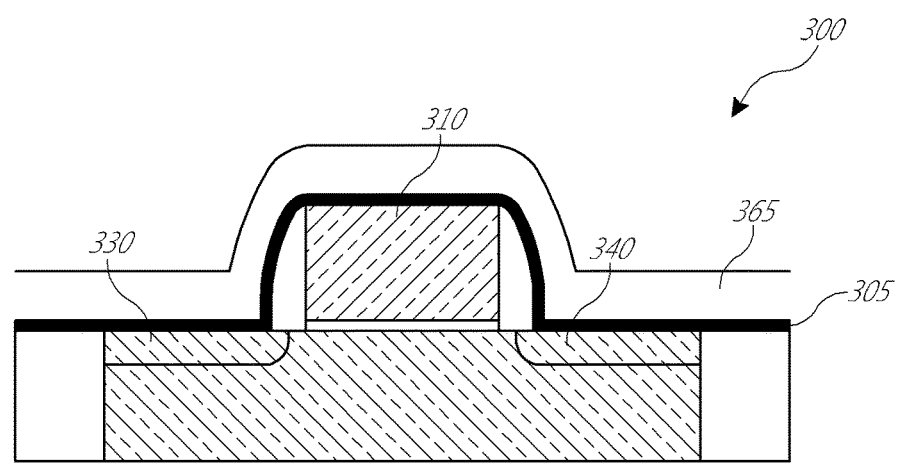

Referring to FIG. 3B, the transistor 300 is shown after deposition of a metal oxide layer 365. As discussed above, ALD of metal oxide, such as nickel oxide (NiO), advantageously forms a conformal layer such that the same thickness of the metal oxide layer 365 forms at both high points (e.g., over the gate electrode 310) and low points (e.g., over the source/drain regions 330/340).

Figure 3C:
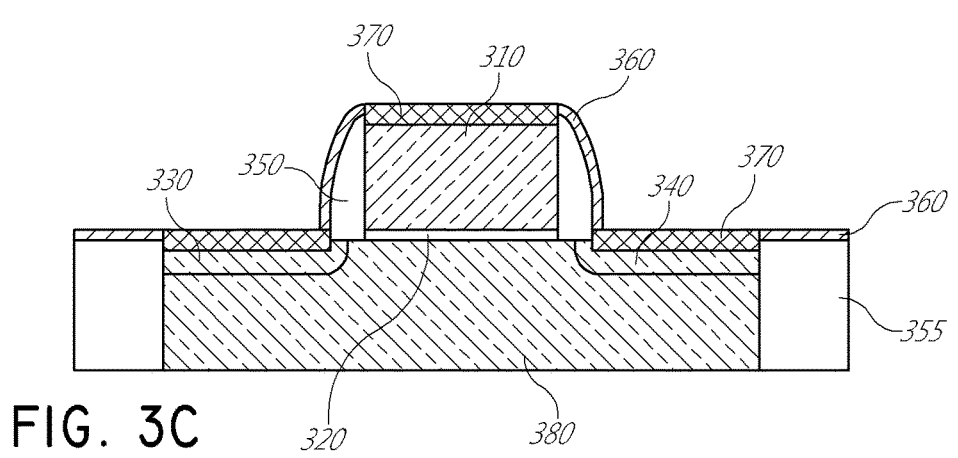

Referring to FIG. 3C, the transistor 300 is shown after reduction and silicidation reactions. As discussed with respect to FIGS. 1 and 2, these reactions can occur in one process or in distinct processes. Metal and silicon readily migrate across the interface formed by the interface layer 305 (FIG. 3B) to form a metal silicide 370 at regions where silicon was exposed to the interface layer deposition, e.g., at the upper surfaces of the source 330, drain 340 and gate electrode 310. Moreover, the metal oxide is reduced to a metal layer 360 in regions where silicon is not accessible (e.g., over the field isolation 355 and dielectric sidewall spacers 350). The unreacted metal can be readily selectively etched without harm to the remaining metal silicide, silicon and dielectric structures.

Figure 4A:
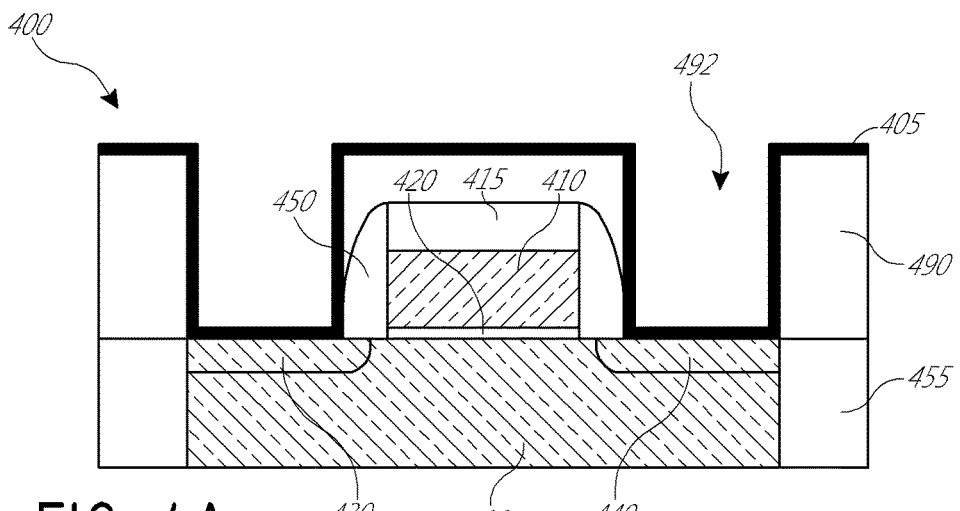
FIGS. 4A through 4C are a series of schematic cross-sections of a transistor with contacts to be formed after insulation by a thick interlayer dielectric, illustrating silicidation of source/drain regions in accordance with some embodiments.
Figure 4B:
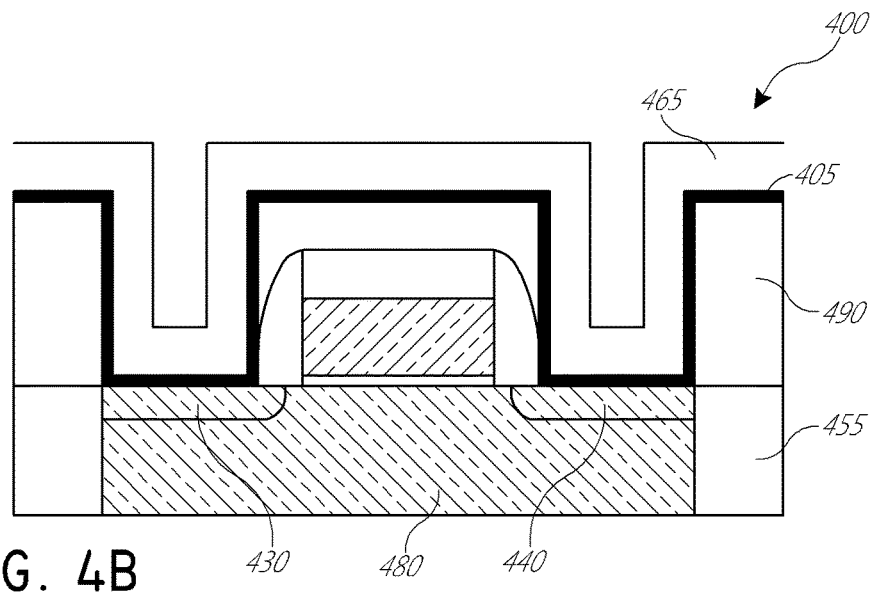
Figure 4C:
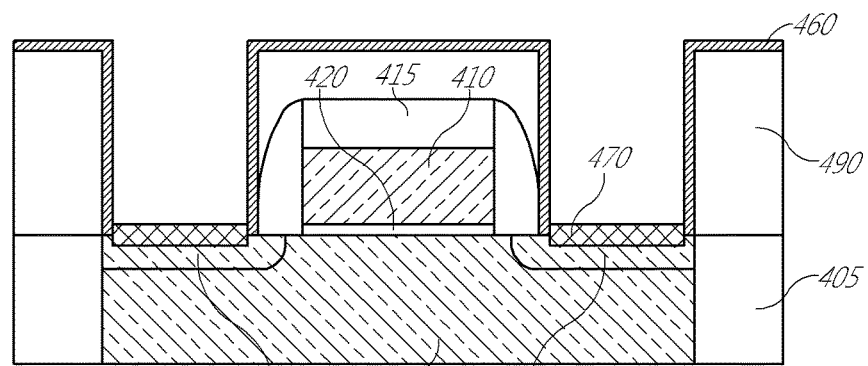

FIGS. 4A-4C illustrate a similar sequence on a similar planar transistor 400. Similar parts to those of FIGS. 3A-3C are referenced by similar reference numerals in the 400 range. The difference between FIGS. 3A-3C and FIGS. 4A-4C is that in FIGS. 4A-4C the interface layer 405 and the metal oxide layer 465 are provided over a thick insulating layer 490 through which contact vias 492 have been formed to open contacts to the source region 430 and drain region 440. In the illustrated arrangement the gate electrode 410 is protected on an upper surface by a dielectric cap 415. The skilled artisan will appreciate that at other locations of the integrated circuit, a contact opening to the gate electrode may be opened simultaneously with the contact vias 492 shown in the cross-section of FIG. 4A.

As integrated circuit dimensions are scaled, the aspect ratio (height:width) of such contact openings 492 continue to climb, making deposition therein challenging. ALD, as described herein, of both the interface layer 405 and the metal oxide layer 465 that provides metal for the silicidation facilitates conform coating such that sufficient metal can be provided at the bottoms of the vias 492 without the need for excess deposition at higher regions. Better control of the supply of metal is thereby afforded, and excess silicon consumption during the silicidation can be avoided.

FIG. 4C shows the result of metal oxide reduction and silicidation, leaving metal silicide layers 470 at the surface of the source/drain regions 430/440. A metal layer 460 is left over regions without access to silicon, such as over surfaces of the insulating layer 490, which can then be removed by selective metal etching, and the contact vias 492 can be filled with a contact plug, as is known in the art.

Figure 5A:
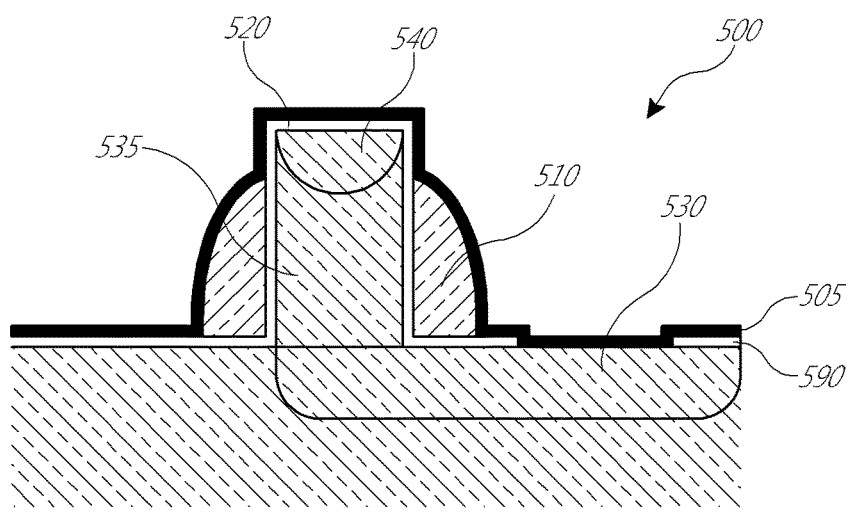
FIGS. 5A through 5C are a series of schematic cross-sections of a three-dimensional transistor, illustrating silicidation of source/drain regions and vertical gate sidewalls in accordance with some embodiments.
Figure 5B:
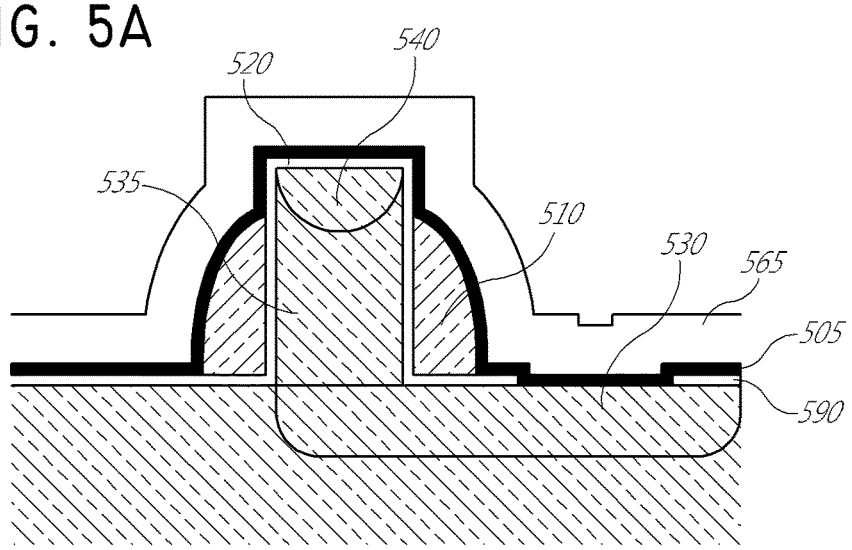
Figure 5C:
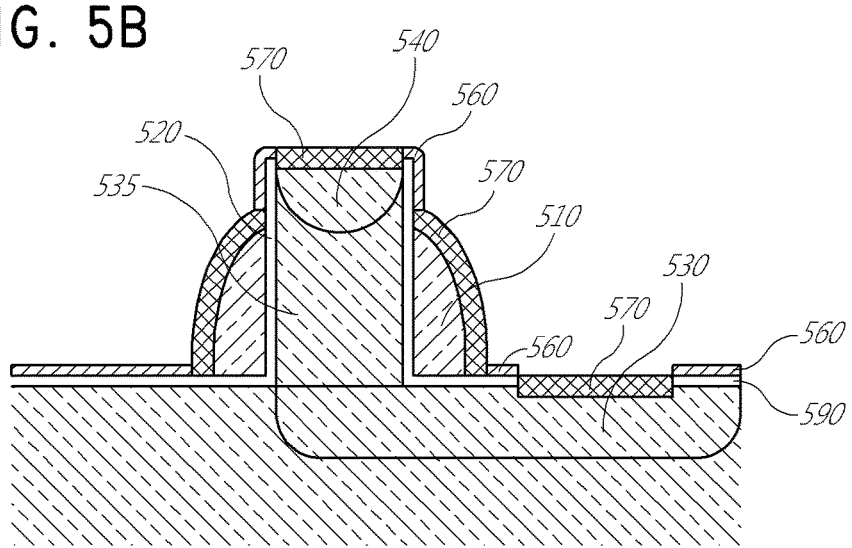

Referring to FIGS. 5A-5C, silicidation according to the methods described herein is illustrated in the context of a three-dimensional transistor. In particular, FIG. 5A shows a vertical transistor 500 with a source region 530 at the base of a vertically extending pillar 535 of semiconductor material. The source region 530 extends laterally to a contact opening in an insulating layer 590, where it is exposed for silicidation of its surface. A drain region 540 is formed at an upper end of the semiconductor pillar 535. A gate dielectric 520 is formed on the sidewall surfaces of the pillar 535, separating the pillar 535 from a gate electrode 510. The gate electrode 510 can be formed, e.g., as a sidewall spacer surrounding the semiconductor pillar 535. In the illustrated embodiment, the gate electrode 510 comprises silicon (e.g., amorphous or polysilicon) and exposed for silicidation prior to deposition of the interface layer 505 of, e.g., solid antimony.

Referring to FIG. 5B, after deposition of the interface layer 505, a metal oxide layer 565 is deposited. ALD for both the interface layer 505 and metal oxide layer 565 facilitate conformal formation over the 3D structure, and an even thickness can be formed not only on the exposed horizontal surface of the source region 530 and the drain region 540, but also on the vertical sidewalls of the gate electrode 510.

Referring to FIG. 5C, the result of reduction of the metal oxide and silicidation is shown. A metal silicide 570 is formed where the interface layer and metal oxide layer had access to silicon, particularly the exposed surfaces of the source region 530, drain region 540, and gate electrode 510. Additionally, a metal layer 560 from the metal oxide is left on surfaces with no access to free silicon, such as over the insulating layer 590 and gate dielectric 520. As noted above, this excess or unreacted metal 560 can be readily removed by selective metal etch prior to further processing.

FIGS. 5A-5C illustrate self-aligned silicidation on a particularly simple example of a 3D transistor design. In certain embodiments, the three-dimensional transistor may include double-gate field effect transistors (DG FET), and other types of multiple gate FETs, including FinFETs for example as found in IBM J. Res. & Dev. Vol. 46 No. 2/3 (2002) by H.-S. P. Wong and Tri-gate FET's for example as found in VLSI Technology Digest of Technical Papers, June 2006, pp. 62-63 by J. Kavalieros and which are each incorporated herein by reference.

Another 3D structure for which the silicidation techniques taught herein are particularly useful is a 3D elevated source/drain structure, as taught in U.S. Patent Publication No. 2009/0315120 to Shifren et al., entitled "RAISED FACET- AND NON-FACET 3D SOURCE/DRAIN CONTACTS IN MOSFETS, filed Jun. 24, 2008, the disclosure of which is incorporated herein by reference in its entirety. Shifren et al. teach elevated source/drain structures that include vertical sidewalls, which would be difficult to silicidize in a self-aligned manner without the methods taught herein.

FIGS. 6A and 6B show schematic diagrams of example film stacks corresponding to various steps in processes for forming metal silicides, according to some embodiments. Although the schematic diagrams of FIGS. 6A and 6B and corresponding description refer to formation of a nickel oxide layer over a CoSb interface layer and TiSb interface layer, respectively, it will be understood that the processes described with reference to FIGS. 6A and 6B may also be applicable to other metal oxide layers and/or other interface layers as described herein. Referring to FIGS. 6A and 6B, a silicon substrate 600 can be provided. In FIG. 6A, a CoSb interface layer 610 can be provided over the silicon substrate 600. The CoSb interface layer can be formed on and in direct contact with the silicon substrate 600. A NiO layer 630 can be provided over the interface layer 610. In some embodiments, the NiO 630 layer can be provided on and in direct contact with the CoSb interface layer 610. The film stack may then be exposed to an annealing process for reducing the NiO to form elemental nickel and inducing silicidation reaction between the silicon of the substrate 600 and the elemental nickel formed from the NiO layer 630 and cobalt from the CoSb interface layer 610. For example, the annealing process may induce diffusion of the elemental nickel, cobalt and silicon across the interface between interface layer 610 and the substrate 600 and silicide reaction between the silicon and the elemental nickel and cobalt. In some embodiments, as described herein, a process for reducing the NiO layer 630 to form elemental nickel can be distinct and separate from a subsequent silicidation process for inducing the silicide reaction between the elemental nickel, cobalt and silicon.

In some embodiments, as shown in FIG. 6A, portions of the NiO layer 630 and CoSb interface layer 610 can remain subsequent to formation of the NiCoSi layer 640. For example, the NiCoSi layer 640 may be formed beneath the remaining CoSb interface layer 610. In some embodiments, any remaining NiO layer 630 and CoSb interface layer 610 can be removed in a post clean process. In some embodiments, elemental nickel formed from the NiO layer 630 can remain over the NiCoSi layer 640 after completion of the silicidation reaction and may be subsequently removed while leaving the NiCoSi layer 640 intact.

Referring to FIG. 6B, in some embodiments, a TiSb interface layer 620 can be formed over the silicon substrate 600 rather than a CoSb interface layer 610. As a result, a NiTiSi layer 650 can be formed from the silicon of the substrate 600, the nickel from the NiO layer 630 and the Ti from the TiSb interface layer 620. For example, the TiSb interface layer 620 can be formed on and in direct contact with the silicon substrate 600. The NiO 630 layer can be provided over, for example on and in direct contact with, the TiSb interface layer 620. The film stack may then be exposed to an annealing process for reducing the NiO to form elemental nickel and inducing silicidation reaction between the silicon of the substrate 600, the elemental nickel formed from the NiO layer 630 and titanium from the TiSb interface layer 620. The annealing process may induce diffusion of the elemental nickel, titanium and silicon across the interface between the TiSb interface layer 620 and the substrate 600, as well as silicide reaction between the silicon, the elemental nickel and titanium to form the NiTiSi layer 750. In some embodiments, as described herein, a process for reducing the NiO layer 630 to form elemental nickel can be distinct and separate from a silicidation process for inducing the silicide reaction between the elemental nickel, titanium and silicon.

In some embodiments, portions of NiO layer 630 and TiSb interface layer 620 can remain subsequent to formation of the NiTiSi layer 650. For example, the NiTiSi layer 650 may be formed beneath the remaining TiSb interface layer 620. In some embodiments, any remaining NiO layer 630 and TiSb interface layer 620 can be removed in a post clean process. In some embodiments, elemental nickel formed from the NiO layer 630 can remain over the NiTiSi layer 650 and may be subsequently removed.

As described herein, in some embodiments, a metal oxide layer and/or an interface layer may be deposited using an atomic layer deposition (ALD) process. A layer deposited using ALD may advantageously allow for deposition at low temperatures while providing desired conformality. A process that provides good conformality and uses low temperatures advantageously allows precise control over the degree of silicidation and can preserve designed transistor junction depths, increasing yield.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

In some embodiments, a first vapor phase precursor is contacted with a surface of the substrate. As described herein, the substrate may comprise one or more three dimensional structures. The first precursor may be contacted with one or more surfaces of a three dimensional structure such to provide conformal deposition on the three dimensional structure. Conditions for contacting the first precursor with the substrate are preferably selected such that no more than about one monolayer of the first precursor is adsorbed on the substrate surface in a self-limiting manner. In some embodiments, excess first precursor, if any, are purged from the reaction chamber, often with a pulse of inert gas such as nitrogen or argon.

In some embodiments, the substrate is contacted with a second vapor phase precursor, which reacts with the first precursor adsorbed to the surface of the substrate. As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

Excess second precursor and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer.

Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition.

Examples of suitable reactors that may be used include commercially available ALD equipment such as the F-120™ reactor, Pulsar™ reactor and Advance™ 400 Series reactor, available from ASM America, Inc. of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. Pat. No. 8,152,922, entitled "GAS MIXER AND MANIFOLD ASSEMBLY FOR ALD REACTOR," filed Aug. 30, 2004 and U.S. Pat. No. 7,105,054, entitled "METHOD AND APPARATUS OF GROWING A THIN FILM ONTO A SUBSTRATE," filed Apr. 16, 2001, the disclosures of each of which are incorporated herein by reference.

In some embodiments, the interface layer and the metal oxide layer can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

A substrate can be loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

Interface Layer

As described herein, the interface layer can be configured to prevent or substantially prevent oxidation of the underlying silicon. The interface layer may have a thickness such that undesired oxidation of the underlying silicon can be avoided during subsequent processing of the substrate, while allowing diffusion therewithin of silicide forming metal. In some embodiments, the interface layer can have a thickness of about 1 nanometers (nm) to about 15 nm. For example, the interface layer can have a thickness of about 1 nm to about 5 nm. In some embodiments, the thickness of the interface layer can be selected based on the composition of the metal oxide layer and/or the composition of the interface layer.

As described herein, the interface layer may comprise one or more silicide forming metals and one or more non-silicide forming elements. For example, in some embodiments, a non-silicide forming element of the interface layer comprises one or more of antimony (Sb), germanium (Ge) and tin (Sn). In some embodiments, a silicide forming metal of the interface layer comprises one or more of cobalt (Co), platinum (Pt), titanium (Ti), aluminum (Al) and hafnium (Hf). In some embodiments, the silicide forming metal can comprise one or more of erbium (Er), ytterbium (Yb) and dysprosium (Dy). For example, the interface layer may be a CoSb layer. In some embodiments, the interface layer may be a TiSb, an AlSb and/or a HfSb layer.

In some embodiments, a process for depositing the interface layer can comprise an atomic layer deposition (ALD) process. In some embodiments, an ALD process for forming the interface layer comprises a plurality of deposition cycles, where one or more of the plurality of cycles comprises alternating and sequential exposure of the substrate to vapor phase precursors for forming the interface layer. For example, a deposition cycle of the ALD process may comprise alternating and sequential contact of the substrate with a first vapor phase precursor and a second vapor phase precursor. In some embodiments, the first vapor phase precursor comprises a silicide forming metal and the second vapor phase precursor comprises a non-silicide forming element.

In some embodiments, a process for depositing the interface layer can comprise a chemical vapor deposition (CVD) process. Precursors and/or process conditions for CVD processes can be selected by a skilled artisan to provide an interface layer comprising desired characteristics. In some embodiments, a CVD process for depositing a Ge containing interface layer can be conducted using germane and/or digermane, and hydrogen gas ($H_2$), at a process temperature of greater than about 300° C., or greater than about 400° C.

Figure 7:
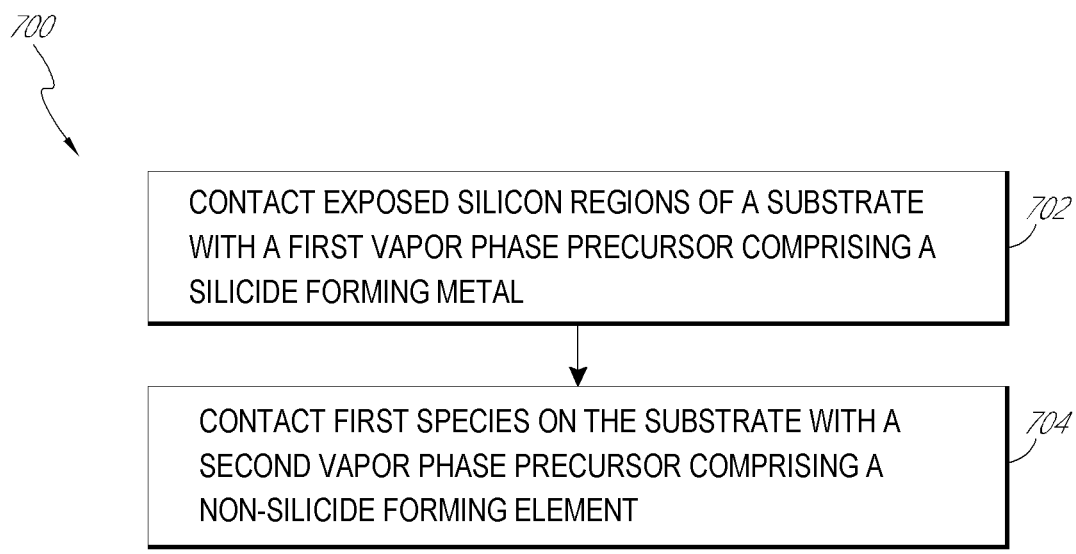
FIG. 7 is a process flow diagram of an example process for forming an interface layer, according to some embodiments.

FIG. 7 is a process flow diagram of a process 700 for forming an interface layer on a substrate in a reaction chamber, according to some embodiments. In block 702, exposed silicon regions of a substrate can be contacted with a first vapor phase precursor comprising a silicide forming metal. For example, the first vapor phase precursor comprising the silicide forming metal can be contacted with the surface of the substrate such that first species adsorb onto the surface. In some embodiments, the first species may be same as the first vapor phase precursor, or may be modified in the adsorbing step, such as by losing one or more ligands. In some embodiments, contacting the substrate with the first vapor phase precursor comprises supplying a first reactant pulse comprising the first vapor phase precursor into the reaction chamber. In block 704, the first species on the substrate can be contacted with a second vapor phase precursor comprising a non-silicide forming element. For example, the first species adsorbed onto the substrate surface can be contacted with the second vapor phase precursor such that the second vapor phase precursor can react with the first species to form at most a monolayer of the interface layer. In some embodiments, less than a monolayer of the interface layer is formed, due for example to physical size and/or steric hindrance restraints. In some embodiments, contacting the first species on the substrate with the second vapor phase precursor comprises supplying a second reactant pulse comprising the second vapor phase precursor into the reaction chamber. As discussed herein, in some embodiments, the interface layer can be a CoSb thin film. In some embodiments, the first vapor phase precursor may comprise a cobalt containing precursor and the second vapor phase precursor may comprise an antimony containing precursor. In some embodiments, the first vapor phase precursor may comprise a titanium containing precursor and the second vapor phase precursor may comprise an antimony containing precursor such that TiSb thin film can be formed.

The first reactant pulse and/or the second react pulse may comprise a carrier gas, such as an inert gas. In some embodiments, the inert gas may comprise nitrogen gas and/or a noble gas, such as argon gas.

In some embodiments, one or more reactant pulses can be followed by an interval in which the substrate is not exposed to the vapor phase precursors, such as an interval during which the first precursor and the precursor are not actively supplied into the reaction chamber. The interval may comprise a purge step and/or transport of the substrate into a space free or substantially free of reactants. For example, the substrate may first be transported to a space free or substantially free of the reactants and the reaction chamber may then be purged of any excess reactants and/or reaction byproducts. In some embodiments, each reactant pulse of a plurality of reactant pulses may be followed by a purge step and/or transport of the substrate to a space free or substantially free of the reactants. The purge step may be configured to remove one or more excess reactants and/or reaction byproducts from the reaction chamber. For example, a purge step may comprise flowing one or more purge gases through the reaction chamber, and/or evacuating the reaction chamber to remove or substantially remove excess reactants and/or reaction byproducts (e.g., by drawing a vacuum upon the reaction chamber). In some embodiments, the purge gas comprises an inert gas. In some embodiments, the purge gas comprises nitrogen gas. In some embodiments, the purge gas comprises a noble gas. In some embodiments, the purge gas comprises argon gas.

In some embodiments, a reactant pulse can be followed by discontinuing flow of the one or more vapor phase precursors into the reaction chamber while continuing flow of the carrier gas. For example, a purge step may comprise continued flow of the carrier gas (e.g., at a same or different flow rate, such as a higher flow rate, as compared to that during the reactant pulse) in order to remove excess reactants and/or reaction byproducts from the reaction chamber. In some embodiments, a purge step may comprise continuing flow of at least one component of a carrier gas comprising a mixture of two or more gases for removing excess reactant from the reaction chamber. In some embodiments, a process for depositing an interface layer may include continuously flowing the carrier gas, or more or more components of a multi-component carrier gas, while pulsing the first vapor phase precursor and the second vapor phase precursor at alternating and sequential intervals.

A duration of the first or second reactant pulse can be selected to provide a desired quantity of the first precursor or second precursor into the reaction chamber. In some embodiments, a reactant pulse can have a duration of about 0.1 seconds (s) to about 10 s, including about 0.1 s to about 5 s. For example, a reactant pulse can have a duration of about 2 s.

In some embodiments, an interval between reactant pulses can be about 0.05 second (s) to about 20 s, including about 1 second to about 15 seconds, about 1 second to about 10 seconds, or about 1 to about 2 seconds. In some embodiments, the interval can be about 5 s. In some embodiments, the interval comprises a purge step for removing excess reactants and/or reaction byproducts from the reactor chamber. In some embodiments, the interval comprises transport of the substrate to a space free or substantially free of reactants. For example, the interval may comprise transport of the substrate to a space free or substantially free of reactants, and a purge step having a duration of about 0.5 s to about 15 s, including about 1 s to about 10 s. For example, the purge step can have a duration of about 5 s. In some embodiments, the purge step can have a duration of about 1 s.

In some embodiments, a duration of the reactant pulse and/or the interval between reactant pulses (e.g., including for example, duration of a purge step) can be selected based a surface area of the substrate on which the interface layer is deposited, an aspect ratio of a three dimensional (3-D) structure on which the interface layer is deposited, and/or a configuration of the reaction chamber. For example, the reactant pulse and/or the interval between reactant pulses may have an increased duration for depositing an interface layer on a larger surface area, over 3-D structures having increased aspect ratios, a surface with complex surface morphology, and/or for deposition in a batch reactor. In some embodiments, an increased reactant pulse duration and/or interval between reactant pulses is selected for deposition on ultra-high aspect ratio features, including for example, features having aspect ratios of about 40:1 and greater, including about 80:1 and greater.

In some embodiments, the substrate temperature during depositing the interface layer can be up to about 500° C. In some embodiments, the substrate temperature can be about 100° C. to about 500° C., about 200° C. to about 500° C., or about 200° C. to about 400° C. In some embodiments, the substrate temperature during depositing the interface layer is less than about 250° C., less than about 200° C., or below about 150° C.

Pressure of the reaction chamber can vary much depending from the reactor used for the depositions. Typically reactor pressures are below normal ambient pressure. In some embodiments, the pressure in the reaction space is preferably from about 0.5 millibar (mbar) to about 20 mbar, more preferably from about 1 mbar to about 10 mbar.

Figure 8:
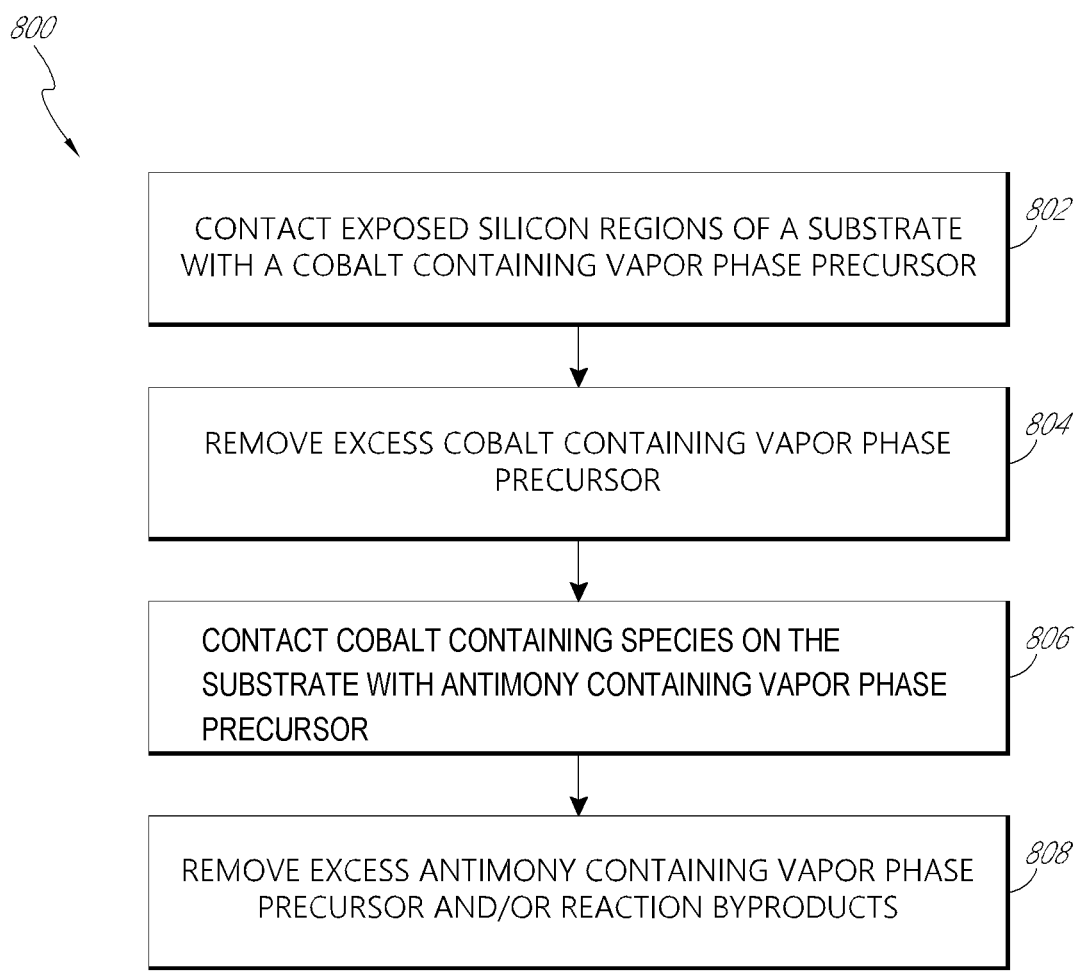
FIG. 8 is a process flow diagram of an example deposition cycle for forming a CoSb interface layer, according to some embodiments.

FIG. 8 is a process flow diagram of a deposition cycle 800 for forming a CoSb interface layer on a substrate in a reaction chamber in accordance with some embodiments. The process for forming the CoSb interface layer may comprise alternating and sequential contact of the substrate surface with an antimony containing vapor phase precursor and a cobalt containing vapor phase precursor.

In block 802, exposed silicon regions of a substrate can be contacted with a cobalt containing vapor phase precursor. For example, a first reactant pulse comprising the cobalt containing vapor phase precursor can be provided into the reaction chamber such that the cobalt containing vapor phase precursor can adsorb onto the substrate surface and form no more than about a single molecular layer. In block 804, excess cobalt containing vapor phase precursor can be removed from the reaction chamber. In block 806, the cobalt containing species on the substrate can be contacted with an antimony containing vapor phase precursor. A second reactant pulse comprising the antimony containing vapor phase precursor can be provided into the reaction chamber such that antimony containing precursor can react with the cobalt containing species adsorbed on the substrate to form CoSb. In block 808, excess antimony containing precursor and/or reaction byproducts can be removed from the reaction chamber.

The deposition cycle 800 can be repeated until a CoSb interface thin film of a desired thickness is formed. In some embodiments a CoSb thin film of from about 10 angstroms (Å) to about 2000 Å, preferably from about 20 Å to about 60 Å, is formed for use as an interface layer prior to metal oxide deposition.

Figure 9:
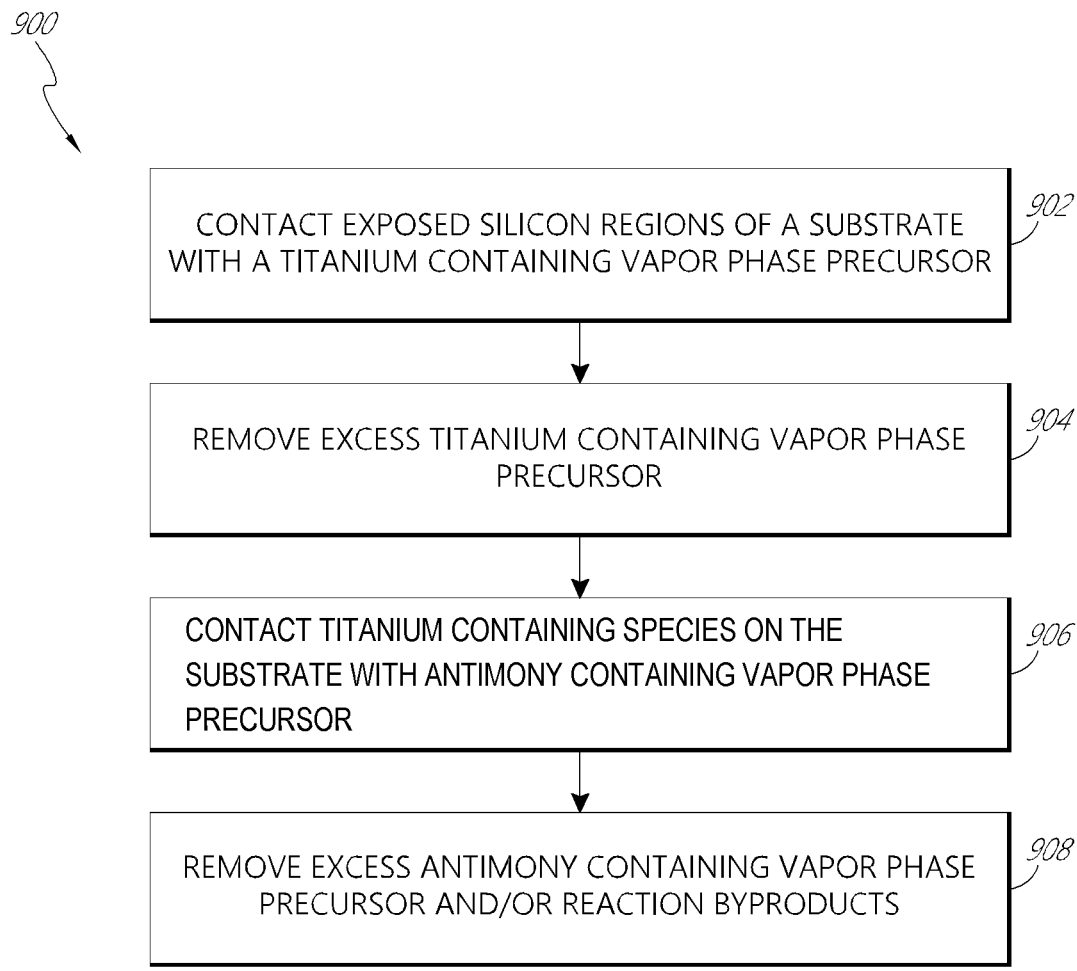
FIG. 9 is a process flow diagram of an example deposition cycle for forming a TiSb interface layer, according to some embodiments.

FIG. 9 is a process flow diagram of a deposition cycle 900 for forming a TiSb interface layer on a substrate in a reaction chamber in accordance with some embodiments. The process for forming the TiSb interface layer may comprise alternating and sequential contact of the substrate surface with an antimony containing vapor phase precursor and a titanium containing vapor phase precursor. In block 902, exposed silicon regions of a substrate can be contacted with a titanium containing vapor phase precursor. For example, a titanium containing vapor phase precursor, such as a first reactant pulse comprising the titanium containing vapor phase precursor, can be provided into the reaction chamber. Titanium containing vapor phase species can adsorb onto the substrate surface and form no more than about a single molecular layer. In block 904, excess titanium containing vapor phase precursor can be removed from the reaction chamber. In block 906, the titanium containing species on the substrate can be contacted with an antimony containing vapor phase precursor. For example, a second reactant pulse comprising the antimony containing vapor phase precursor can be provided into the reaction chamber such that antimony containing precursor reacts with the titanium containing species adsorbed on the substrate to form TiSb. In block 908, excess antimony containing precursor and/or reaction byproducts can be removed from the reaction chamber.

The deposition cycle 900 can be repeated until a TiSb interface thin film of a desired thickness is formed. In some embodiments, a TiSb thin film of about 10 angstroms (Å) to about 2000 Å, preferably about 20 Å to about 60 Å, is formed for use as an interface layer prior to metal oxide deposition.

Although the illustrated deposition cycle 800 of FIG. 8 begins with provision of the cobalt containing precursor and the deposition 900 of FIG. 9 begins with provision of the titanium containing precursor, in other embodiments the deposition cycle can begin with the provision of the antimony containing precursor.

In some embodiments, the vapor phase precursor comprising the silicide forming metal comprises a metal halide, such as a chloride. For example, the metal halide may be a cobalt halide, molybdenum halide, a tantalum halide, or a tungsten halide. In some embodiments, a molybdenum containing vapor phase precursor for forming an interface layer comprises $MoCl_5$. In some embodiments, a tantalum containing vapor phase precursor comprises $TaCl_5$. In some embodiments, a tungsten containing vapor phase precursor comprises $WF_6$. In some embodiments, cobalt containing vapor phase precursor has a formula of $CoX_2$, wherein X is a halogen element. For example, the Co source is $CoCl_2$, $CoBr_2$, $CoF_2$ or $CoI_2$. More preferably the Co source is $CoCl_2$. In some embodiments, the titanium containing vapor phase precursor can have a formula of $TiX_4$, wherein X is a halogen element. For example, the Ti source is $TiCl_4$, $TiBr_4$, $TiF_4$ or $TiI_4$. More preferably the Ti source is $TiCl_4$.

In some embodiments, an antimony containing vapor phase precursor can have a formula of $Sb(SiR^1R^2R^3)_3$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc. In some embodiments, the antimony containing vapor phase precursor is $Sb(SiEt_3)_3$ or $Sb(SiMe_3)_3$. In some embodiments, the antimony containing vapor phase precursor can be a halide. For example, the precursor may be $SbCl_3$. In some embodiments, a germanium containing vapor phase precursor can comprise germane, germanium alkoxide, tetrakis(dimethylamino)germanium (TDMAGe), and/or germanium halide. In some embodiments, the germanium halide may be $GeCl_4$. In some embodiments, a tin containing vapor phase precursor can comprise stannane, tin alkoxide, tin halide, and/or tetrakis(dimethylamino)tin (TDMAGe).

In some embodiments, the cobalt containing vapor phase precursor in an ALD process for forming a CoSb interface layer is $CoCl_2$ and the antimony containing vapor phase precursor is tris(trimethylsilyl)antimony, $Sb(SiMe_3)_3$. In some embodiments, the titanium containing vapor phase precursor in an ALD process for forming a TiSb interface layer is $TiCl_4$ and the antimony containing vapor phase precursor is tris(trimethylsilyl)antimony, $Sb(SiMe_3)_3$.

In some embodiments, an interface layer can be deposited using ALD processes comprising alternately and sequentially contacting the substrate with multiple reactants. In some embodiments, a silicide forming metal can be incorporated into the layer by a deposition cycle using two reactants, and a non-silicide forming element can be incorporated into the layer by a deposition cycle using two reactants. For example, a silicide forming metal can be introduced into the growing layer by alternately and sequentially exposing a substrate to a precursor comprising the silicide forming metal and a first reducing agent. In some embodiments, a non-silicide forming element can be introduced by alternately and sequentially exposing a substrate to a precursor comprising the non-silicide forming element and a second reducing agent. For example, an ALD process for depositing an interface layer can include a super cycle comprising one or more deposition sub-cycles for introducing the silicide forming metal, followed by one or more deposition sub-cycles for introducing the non-silicide forming element, or vice versa. In some embodiments, a sub-cycle for introducing the silicide forming metal comprises exposing the substrate to a precursor comprising the silicide forming metal and a first reducing agent. In some embodiments, a sub-cycle for introducing the non-silicide forming element comprises exposing the substrate to a precursor comprising the non-silicide forming element and a second reducing agent. In some embodiments, the sub-cycle for introducing the silicide forming metal can be repeated a number of times prior to performing the one or more sub-cycles for introducing the non-silicide forming element, or vice versa. In some embodiments, the number of each of the sub-cycles in the super-cycle process can be adjusted to provide an interface layer comprising desired characteristics. In some embodiments, the super-cycle can be repeated a number of times to deposit an interface layer comprising the desired thickness.

In some embodiments, a sub-cycle for introducing cobalt into an interface layer can comprise exposing the substrate to tertbutylallylcobalttricarbonyl (tBu-AllylCo(CO)$_3$) and a reducing agent comprising hydrogen and/or hydrazine. In some embodiments, a sub-cycle for introducing titanium, tantalum, or tungsten can comprise exposing the substrate to a metal halide and a reducing agent comprising hydrogen and/or hydrazine. For example, the metal halide may be MoCl$_5$, TaCl$_5$ or WF$_6$. In some embodiments, a sub-cycle for introducing tungsten can comprise exposing the substrate to WF$_6$ and disilane. In some embodiments, a sub-cycle for introducing antimony into an interface layer can comprise exposing the substrate to an alkylsilyl antimony and SbCl$_3$. In some embodiments, the alkylsilyl antimony can have a formula of Sb(SiR$^1$R$^2$R$^3$)$_3$, wherein R$^1$, R$^2$, and R$^3$ are alkyl groups comprising one or more carbon atoms. The R$^1$, R$^2$, and R$^3$ alkyl groups can be selected based on the desired physical properties of the precursor such as volatility, vapor pressure, toxicity, etc. In some embodiments, the alkylsilyl antimony is Sb(SiEt$_3$)$_3$ or Sb(SiMe$_3$)$_3$.

Figure 10:
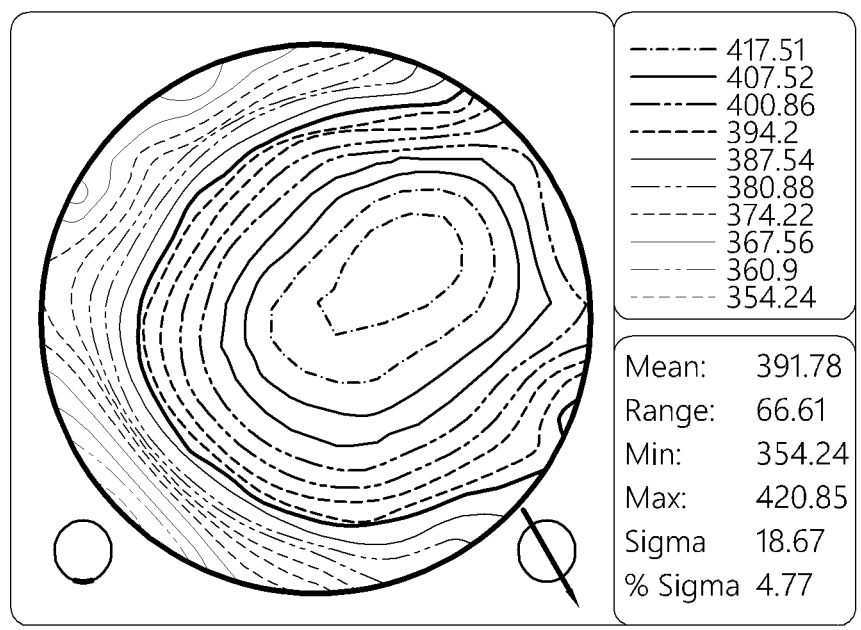
FIG. 10 shows an example deposition performance of TiSb deposited on a blanket wafer.

FIG. 10 shows an example of deposition performance of TiSb deposited on blanket wafer at substrate temperatures of about 100° C. The wafer map shows thickness in angstroms (Å) across the wafer. The TiSb film was deposited using ALD processes comprising TiCl$_4$ and Sb(SiMe$_3$)$_3$. The measurements shown in FIG. 10 were taken after 200 deposition cycles. The deposition process demonstrated an average deposition rate of about 2 Å/cycle, and the deposited TiSb films demonstrated a refractive index of about 1.9. As shown in FIG. 10, the average thickness of the TiSb film after 200 deposition cycles was about 391.78 Å, and while demonstrating a 1-sigma (1-σ) uniformity about 4.77%.

ALD of Metal Oxide

In some embodiments, a metal oxide thin film can be deposited over the interface layer. As described herein, the metal oxide layer may comprise a silicide forming metal. According to some embodiments, a metal oxide thin film is formed on the interface layer by a vapor deposition process, such as by an ALD type process comprising multiple pulsing cycles, each cycle comprising:

pulsing a vaporized metal precursor into the reaction chamber to form at most a molecular monolayer of the metal precursor on the substrate, purging the reaction chamber to remove excess metal precursor and reaction by products, if any, providing a pulse of a second reactant comprising an oxygen source onto the substrate, purging the reaction chamber to remove excess second reactant and any gaseous by-products formed in the reaction between the metal precursor layer on the first surface of the substrate and the second reactant, and repeating the pulsing and purging steps until a metal oxide thin film of the desired thickness has been formed.

The thin metal oxide film typically comprises multiple monolayers of a single metal oxide. However, in other embodiments, the final metal structure may comprise two or more different metal oxides. For example, the growth can be started with the deposition of a first metal oxide and ended with the deposition of a second metal oxide. In other embodiments, alternating layers of metal oxides can be deposited.

The metal oxide is preferably selected from the group consisting of Ni, Ti, Zr, Hf, V, Nb, Ta, Cr, Mo, W, Co, Cu, Fe, Ru, Ir, Rh, Pd and Pt oxides and may be in some cases electrically conductive, such as in a case of IrO$_2$ or RuO$_2$. In some embodiments, the metal oxide thin film is a nickel oxide thin film, such as NiO. In some embodiments, the metal oxide thin film is a cobalt oxide thin film, such as CoO.

Suitable metal precursors may be selected by the skilled artisan. In general, metal compounds where the metal is bound or coordinated to oxygen, nitrogen, carbon or a combination thereof are preferred. In some embodiments the metal precursors are organic compounds. More preferably betadiketonate, betadiketiminato compounds, amidinate compounds, aminoalkoxide, ketoiminate or cyclopentadienyl compounds or derivatives thereof are used. In some embodiments, X(acac)$_y$ or X(thd)$_y$ compounds are used, where X is a metal, y is generally, but not necessarily between 2 and 3 and thd is 2,2,6,6-tetramethyl-3,5-heptane-dionato.

In some embodiments, metal precursors for depositing cobalt oxide can include one or more of bis(2,2,6,6-tetramethyl-3,5-heptanedionato)cobalt(II) (Co(thd)$_2$), bis(cyclopentadienyl)cobalt(II) (Co(Cp)$_2$), and tertbutylallylcobalttricarbonyl (tBu-AllylCo(CO)$_3$). In some embodiments, cobalt oxide can be deposited from alternating and sequential pulses of a Co precursor and an oxygen source, like water, ozone, oxygen plasma, oxygen radicals or oxygen atoms.

Some examples of suitable betadiketiminato (e.g., Ni(pda)$_2$) compounds for depositing nickel oxide are mentioned in U.S. Patent Publication No. 2009-0197411, filed Feb. 2, 2009, entitled "NEW METAL PRECURSORS CONTAINING BETADIKETIMINATO LIGANDS," the disclosure of which is incorporated herein in its entirety. Some examples of suitable amidinate compounds (e.g., Ni($^i$Pr-AMD)$_2$) are mentioned in U.S. Patent Publication No. 2006-0141155, filed Nov. 14, 2003, entitled "ATOMIC LAYER DEPOSITION USING METAL AMIDINATES," the disclosure of which is incorporated herein in its entirety. Some examples of suitable aminoalkoxide compounds are mentioned in U.S. Patent Publication No. 2008-0171890, filed Apr. 7, 2005, entitled "VOLATILE NICKEL AMINO-ALKOXIDE COMPLEX AND DEPOSITION OF NICKEL THIN FILM USING SAME," the disclosure of which is incorporated herein in its entirety.

When depositing nickel oxide thin films, preferred metal precursors can be selected from the group consisting of nickel betadiketonate compounds, nickel betadiketiminato compounds, nickel amidinate compounds, nickel cyclopentadienyl compounds, nickel carbonyl compounds and combinations thereof. The nickel precursor may also comprise one or more halide ligands. In preferred embodiments, the precursor is nickel betadiketiminato compound, such bis(4-N-ethylamino-3-penten-2-N-ethyliminato)nickel (II) [Ni(EtN-EtN-pent)$_2$], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as Ni(acac)$_2$, Ni(thd)$_2$ or nickel cyclopentadienyl compounds, such as Ni(cp)$_2$, Ni(Mecp)$_2$, Ni(Etcp)$_2$ or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments nickel oxide, preferably NiO, is deposited from alternating and sequential pulses of a Ni precursor and an oxygen source, like water, ozone, oxygen plasma, oxygen radicals or oxygen atoms. The Ni precursor preferably comprises a betadiketonate or betadiketiminato compounds and more preferably is Ni(acac)$_2$. In some embodiments the Ni precursors have at least one Ni—N bond. The reaction temperature is preferably less than about 300° C., more preferably less than about 200° C. In some embodiments, the reaction temperature can be in the range of about 60° C. to about 150° C. for example, in the case of Ni(cp)$_2$.

The metal precursor employed in the ALD type processes may be solid, liquid or gaseous material under standard conditions (room temperature and atmospheric pressure), provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to about 10 seconds. However, depending on the substrate type and its surface area, the pulsing time may be even higher than 10 seconds.

Preferably, for a 300 mm wafer in a single wafer ALD reactor, the metal precursor is pulsed for from about 0.05 to about 10 seconds, more preferably for from about 0.1 to about 5 seconds and most preferably for from about 0.3 to about 3.0 seconds. The oxygen-containing precursor is preferably pulsed for from about 0.05 to about 10 seconds, more preferably for from about 0.1 to about 5 seconds, most preferably for from about 0.2 to about 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In one embodiment, for deposition on 300 mm wafers the flow rate of the metal precursor is preferably between about 1 standard cubic centimeters per minute (sccm) and about 1000 sccm without limitation. The mass flow rate of the metal precursor is usually lower than the mass flow rate of the oxygen source, which is usually between about 10 sccm and about 10000 sccm without limitation, more preferably between about 100 sccm—about 2000 sccm and most preferably between about 100 sccm—about 1000 sccm.

The pressure in the reaction chamber is typically from about 0.01 millibar (mbar) to about 20 mbar, more preferably from about 1 to about 10 mbar. However, in some cases the pressure will be higher or lower than this range, as can be readily determined by the skilled artisan.

The oxygen source may be an oxygen-containing gas pulse and can be a mixture of oxygen and inactive gas, such as nitrogen or argon. In some embodiments the oxygen source may be a molecular oxygen-containing gas pulse. The preferred oxygen content of the oxygen-source gas is from about 10% to about 25%. Thus, one source of oxygen may be air. In some embodiments, the oxygen source is molecular oxygen. In some embodiments, the oxygen source comprises an activated or excited oxygen species. In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen source is oxygen plasma.

As mentioned above, the metal oxide ALD process typically comprises alternating pulses of metal precursor and a reactant comprising an oxygen source. The oxygen source pulse may be provided, for example, by pulsing ozone or a mixture of ozone and another gas into the reaction chamber. In other embodiments, ozone is formed inside the reactor, for example by conducting oxygen containing gas through an arc. In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma the pathway to the substrate can be optimized to maximize electrically neutral species and minimize ion survival before reaching the substrate.

Before starting the deposition of the film, the substrate is typically heated to a suitable growth temperature. Preferably, the growth temperature of the metal thin film is less than about 400° C., more preferably less than about 350° C. and even more preferably less than about 200° C. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan using routine experimentation.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and about 30 seconds, more preferably between about 1 and about 10 seconds, but it can be on order of minutes or more in some cases, for example, where large surface areas and volumes are present.

A metal oxide, such as nickel oxide, is deposited by ALD over the interface layer to form a conformal thin film of between about 1 nm and about 200 nm, preferably between about 3 nm and about 100 nm in thickness. As described above, in some embodiments, the metal oxide is deposited conformally over vertical and horizontal surfaces. Although described in terms of NiO deposition, the method may be readily adjusted to deposit other metal oxides. As discussed previously, deposition of metal oxide takes place in a reaction space maintained at less than about 300° C., more preferably less than about 250° C. and even more preferably less than about 200° C. and between about 0.01 and about 20 mbar, more preferably between about 1 and about 10 mbar. In certain embodiments, deposition by ALD comprises contacting the substrate with a vapor phase metal source chemical and a vapor phase oxygen source chemical. This may be done sequentially with either the metal source chemical or the oxygen source chemical being pulsed into the reaction space before the other. In certain embodiments, a purge gas may be introduced into the reaction space between sequential pulses of the metal and oxygen source chemicals to aid in removing excess reactant and reaction byproducts, if any, from the reaction space. In certain embodiments, purging may take place with the aid of a vacuum pump. In other embodiments, if an inert carrier gas is used to help flow in the metal or oxygen source chemicals, the inert gas may also function as the purge gas.

The metal source chemical may comprise Ni, Ti, Zr, Hf, V, Nb, Ta, Cr, Mo, W, Co, Cu, Fe, Ru, Ir, Rh, Pd and Pt. The oxygen source chemical may be chosen from $O_2$, $H_2O$, $O_3$, oxygen plasma, oxygen radicals or oxygen atoms or a reactive oxygen gas. By depositing metal oxide by ALD, the metal oxide is placed in direct contact with the interface layer in at least one location, but preferably a plurality of regions, and the interface layer thus prevents direct exposure of the underlying silicon to the oxidizing environment of the metal oxide deposition.

Methods for ALD of metal oxide are also disclosed in Utriainen et al., "Studies of metallic thin film growth in an atomic layer epitaxy reactor using M(acac)$_2$ (M=Ni, Cu, Pt) precursors," APPLIED SURFACE SCIENCE 157 (2000), pp. 151-158, and Utriainen et al., "Studies of NiO thin film formation by atomic layer epitaxy", MATERIALS SCI- ENCE AND ENGINEERING B54 (1998), pp. 98-103, the disclosures of which are expressly incorporated herein by reference.

CVD of Metal Oxide

The skilled artisan will appreciate that the metal oxide need not be deposited by ALD and that other conformal techniques (e.g., CVD) can also be used. CVD of nickel oxide, for example, can be conducted by known techniques, such as the provision of metal organic nickel source with an oxidizing source. In some embodiments, CVD of cobalt oxide can be conducted by known techniques, such as the provision of metal organic cobalt source with an oxidizing source. In some embodiments, a metal organic cobalt source can comprise a dicobalt carbonyl. In some embodiments, a metal organic cobalt source can comprise one or more of bis(2,2,6,6-tetramethyl-3,5-heptanedionato)cobalt(II) (Co(thd)$_2$), bis(cyclopentadienyl)cobalt(II) (Co(Cp)$_2$), and/or tertbutylallylcobalttricarbonyl (tBu-AllylCo(CO)$_3$). In some embodiments, cobalt oxide can be deposited from pulses of a Co precursor and an oxygen source, like water, ozone, oxygen plasma, oxygen radicals or oxygen atoms.

CVD processes typically involve gas phase reactions between two or more reactants. The reactants can be provided simultaneously to the reaction space or substrate. The substrate or reaction space can be heated to promote the reaction between the gaseous reactants. CVD deposition occurs when the reactants are provided to the reaction space. In some embodiments the reactants are provided until a thin film having a desired thickness is deposited. In some embodiments cyclical CVD can be used with multiple cycles used to deposit a thin film having a desired thickness. In some embodiments one or more plasma reactants can be used in the CVD process.

In some embodiments the ALD-processes can be modified to be partial CVD processes. In some embodiments the ALD processes can be modified to be pulsed CVD processes. In some embodiments the ALD processes are modified to use overlapping or partially overlapping pulses of reactants. In some embodiments the ALD processes are modified to use extremely short purge times, such as below about 0.1 s (depending on the reactor). In some embodiments the ALD processes are modified to use no purge at all. In some embodiments the no purge is used after the metal reactant pulse. In some embodiments no purge is used after the oxygen reactant pulse. In some embodiments no purge is used after either the metal reactant pulse or the oxygen reactant pulse.

Reduction and Solid State Reaction

As described herein, in some embodiments, reduction of the metal oxide to metal can be conducted simultaneously with silicidation reaction using a moderately reducing environment (e.g., $H_2$ or $H_2/N_2$) at temperatures (e.g., greater than about 250° C., more preferably greater than about 300° C. and in some embodiments about 400° C. or greater or even about 500° C. or greater) sufficient to effect silicidation through the interface layer. In other arrangements, reduction can be conducted independently of silicidation, especially at lower temperatures using stronger reducing agents. More details and options for the reduction and silicidation reactions are provided below.

Regardless of whether simultaneous with the solid phase reaction or preceding it, the metal oxide layer, such as nickel oxide, is reduced to metal. In certain embodiments, as discussed in U.S. Pat. No. 6,921,712, filed Nov. 15, 2002, entitled "PROCESS FOR PRODUCING INTEGRATED CIRCUITS INCLUDING REDUCTION USING GASEOUS ORGANIC COMPOUNDS," the entire disclosure of which is incorporated by reference, the metal oxide layer is contacted with vapor phase reducing agents, which may include $H_2$, $NH_3$, hydrogen containing plasma, hydrogen radicals or hydrogen atoms and reactive organic compounds, which contain at least one functional group selected from the group of alcohol (—OH), aldehyde (—CHO), and carboxylic acid (—COOH). The vapor phase reducing agents form stronger bonds with the oxygen in the metal oxide layer than the metal to the oxygen. Thus, the gaseous reducing agent is capable of taking away the oxygen that was bound to the metal oxide and thus leaving an elemental metal layer on the substrate surface. This reduction step can be performed at temperatures between about 25° C. and about 400° C. and has the benefit of a high rate of reduction, an operation time of between about 1 s and about 1000 s, and low levels of carbon or hydrogen impurities. A skilled artisan will recognize that the metal oxide layer may be reduced to metal by other methods known in the art, such as for example by $H_2$ plasma, formic acid or ethanol.

In one embodiment, the NiO layer is reduced by exposure to an organic reducing agent that is capable of removing oxygen from the metal oxide, leaving elemental nickel on the substrate. Preferably the NiO layer is reduced by exposure to an organic reducing agent in vapor form.

The substrate containing the nickel oxide layer to be reduced is placed in a reaction space, such as an ALD reaction chamber, and the reaction space is evacuated to vacuum. The organic reducing agent is preferably vaporized and fed to the reaction space, optionally with the aid of an inert carrier gas, such as nitrogen. In one embodiment a vapor mixture is used, comprising two or more reducing agents.

The reducing agent vapor is contacted with the substrate, preferably at low pressure, whereby the nickel oxide layer is reduced at least partly to nickel metal and the reducing agent is oxidized. Typically the reaction space is then purged with an inert carrier gas to remove the unreacted organic reducing agent and the reaction products and/or by-products.

The reactions between nickel oxide and the organic reducing agent may be carried out in a wide temperature range, even as low as room temperature. Preferably, reduction with an organic reducing agent is carried out at low temperatures. Kinetic factors and the diffusion rate of oxygen from nickel oxide to the nickel surface set a lower limit to the actual process temperatures that can be applied successfully. The temperature in the reaction space is preferably in the range of about 200° C. to about 450° C., more preferably about 300° C. to about 430° C. and even more preferably about 310° C. to about 400° C. In some cases, such as the case of very thin metal oxide films, the reduction temperature can be even lower than about 200° C. For example, in case of hydrogen containing plasma, hydrogen radical or hydrogen atom reduction can be performed from about 20° C. to about 450° C. If reduction and subsequent process steps are not carried out in situ, the reduction temperature may be less than about 400° C. Reduction and silicidation may also happen simultaneously.

The pressure in the reaction space is preferably from about 0.01 to about 20 mbar, more preferably from about 1 to about 10 mbar.

The processing time will vary according to the thickness of the layer to be reduced. A layer of nickel oxide having a thickness of up to about 300 to about 400 nm can be reduced in approximately 3 to 5 minutes. For layers having a thickness of approximately 0.1 to 10 nm, the processing time is in the order of seconds. Reduction may be somewhat faster in case of plasma reduction.

According to one embodiment, NiO is reduced to nickel with one or more organic reducing agents. The organic reducing agents preferably have at least one functional group selected from the group consisting of alcohol (—OH), aldehyde (—CHO), and carboxylic acid (—COOH).

Such reducing agents have the advantage that the reaction by-products are volatile and can be easily removed from the reaction space. In the reduction of nickel oxide, the reducing agent is oxidized. Thus, alcohols are oxidized into aldehydes and ketones, aldehydes are oxidized into carboxylic acids and carboxylic acids are oxidized into carbon dioxide. Depending on the specific reactants, water may be formed as a gaseous by-product.

These bulky source chemical molecules also do not easily diffuse inside the metal oxide film. Thus, the reduction reaction takes place only at the surface of the metal oxide layer. Gaseous by-products are not formed inside the film, but only at the surface. The structural integrity of the metal film is thereby preserved and the formation of pinholes in the film is avoided.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

$$R^1\text{—OH} \quad (I)$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$\begin{array}{c} \text{OH} \\ | \\ R^1\text{—CH—}R^1 \end{array} \quad (II)$$

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$\begin{array}{c} \text{OH} \\ | \\ R^1\text{—C—}R^1 \\ | \\ R^1 \end{array} \quad (III)$$

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}\text{—}R^2\text{—OH} \quad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3\text{—CHO} \quad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC\text{—}R^4\text{—CHO} \quad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5-COOH \quad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

As noted, other methods of reduction are contemplated. In one embodiment, nickel oxide is reduced by treatment with $H_2$ plasma. Briefly, the substrate comprising the nickel oxide is placed in a reaction chamber, such as an ALD reaction chamber. A gas mixture comprising $H_2$ is allowed to flow into the chamber and Radio Frequency (RF) power is applied to create a plasma discharge in the $H_2$ gas. The plasma discharge reduces the nickel oxide, leaving elemental nickel. Care must be taken not to damage the nickel surface or other exposed substrate surfaces.

In a further embodiment, nickel oxide is reduced by exposure to $H_2$ gas or forming gas at elevated temperature. Briefly, the substrate comprising the nickel oxide is placed in a reaction chamber. $H_2$ gas is allowed to flow into the reaction chamber. The temperature of the reaction chamber is set to between about 200° C. and about 600° C., more preferably at between about 300° C. and about 500° C. Reduction with moderate reducing agents at such elevated temperatures has been found to simultaneously effect silicidation, obviating a subsequent silicidation anneal.

Where the metal oxide to is independently reduced to metal without silicidation, or with incomplete silicidation, the substrate is then annealed at a silicidation temperature, i.e., the temperature at which conversion of the metal layer to a silicide occurs. For example, the silicidation temperature is the temperature at which conversion of the Ni layer into nickel containing silicide takes place. In some embodiments, the temperature of conversion is between about 200° C. and about 300° C. Preferably, the anneal is a rapid thermal anneal, in which heating is conducted for less than about 2 minutes, more preferably less than about 1 minute. The silicide film formed by annealing advantageously has better adhesion to the underlying silicon substrate and has a more diffuse boundary than a similar film formed by, e.g., deposition processes. It will be appreciated that in certain embodiments, the silicide films preferably contact underlying source and drains regions.

It will also be appreciated that the annealing step can be performed in the same reaction space as the previous metal oxide layer deposition and/or reduction. The annealing step may also be performed in an anneal station different from the reaction space for the deposition and/or reduction. Such an anneal station can be, e.g., the reactor of a Levitor® system, commercially available from ASM International, N.V. of Bilthoven, The Netherlands. A reactor according to the Levitor® design is described in U.S. Pat. No. 6,183,565, the entire disclosure of which is incorporated herein by reference.

Post-Silicidation Anneal

In certain embodiments, an additional conversion step may be performed to convert metal silicide from one phase to the desired phase. In some embodiments, the conversion step may be carried out in the same reaction space as the metal oxide deposition step and/or the annealing step. In other embodiments, the conversion step may be performed in a separate reaction space. The conversion step may preferably be carried out at a temperature between about 200° C. and about 700° C., including about 200° C. to about 500° C., a pressure between about 0.01 mbar and about 10 mbar, and from about 5 s to about 1000 s.

In some embodiments, the additional conversion step can be performed in an inert atmosphere. For example, the conversion step can be performed in an atmosphere comprising hydrogen gas ($H_2$) and nitrogen gas ($N_2$). In some embodiments, the conversion step can be performed in an atmosphere comprising argon (Ar).

What is claimed is:

1. A method of forming a metal silicide, comprising:
   depositing an interface layer on exposed silicon regions of a substrate, the interface layer comprising a first silicide forming metal and a non-silicide forming element;
   depositing a metal oxide layer over the interface layer, wherein the metal oxide layer comprises a second silicide forming metal; and
   heating the substrate to form the metal silicide beneath the interface layer, the metal silicide comprising silicon from the formerly exposed silicon regions, first silicide forming metal from the interface layer, and second silicide forming metal from the metal oxide layer,
   wherein depositing the interface layer comprises a plurality of cycles of a vapor deposition process, each cycle of the plurality of cycles comprising alternately and sequentially contacting the surface of the substrate with a first vapor phase precursor comprising the first silicide forming metal and a second vapor phase precursor comprising the non-silicide forming element, wherein the first vapor phase precursor reacts with the second vapor phase precursor.

2. The method of claim 1, wherein the second silicide forming metal is different from the first silicide forming metal.

3. The method of claim 1, wherein the first silicide forming metal comprises cobalt (Co), titanium (Ti) or platinum (Pt).

4. The method of claim 1, wherein the non-silicide forming element comprises antimony (Sb), germanium (Ge) or tin (Sn).

5. The method of claim 1, further comprising reducing the metal oxide layer to form elemental second silicide forming metal.

6. The method of claim 1, wherein the second silicide forming metal of the metal oxide layer is nickel and the metal oxide layer is a nickel oxide thin film.

7. The method of claim 1, wherein the second silicide forming metal of the oxide layer is cobalt, and the metal oxide layer is a cobalt oxide thin film.

8. The method of claim 1, wherein the first vapor phase precursor is a metal halide.

9. The method of claim 8, wherein the second vapor phase precursor is an antimony containing precursor having the formula $Sb(SiMe_3)_3$.

10. A method of forming a metal silicide, comprising:
    depositing an interface layer on exposed silicon regions of a substrate, the interface layer comprising a first silicide forming metal and a non-silicide forming element;
    depositing a metal oxide layer over the interface layer, wherein the metal oxide layer comprises a second silicide forming metal; and
    heating the substrate to form the metal silicide beneath the interface layer, the metal silicide comprising silicon from the formerly exposed silicon regions, first silicide forming metal from the interface layer, and second silicide forming metal from the metal oxide layer, wherein depositing the interface layer comprises a plurality of super-cycles, each super-cycle comprising:

a first sub-cycle comprising exposing the substrate to a first vapor phase precursor comprising the first silicide forming metal and a first reducing agent; and a second sub-cycle comprising exposing the substrate to a second vapor phase precursor comprising the non-silicide forming element and a second reducing agent.

11. The method of claim 10, wherein the first vapor phase precursor comprises cobalt, and wherein the first reducing agent comprises at least one of hydrogen gas and hydrazine.

12. The method of claim 11, wherein the first vapor phase precursor is tBu-AllylCo(CO)$_3$.

13. The method of claim 10, wherein the second vapor phase precursor comprises SbCl$_3$, and wherein the second reducing agent comprises Sb(SiR$^1$R$^2$R$^3$)$_3$, wherein R$^1$, R$^2$, and R$^3$ are alkyl groups.

14. A method of forming metal silicide, comprising:

depositing an interface layer over at least one exposed silicon region of a substrate, wherein depositing the interface layer comprises a plurality of atomic layer deposition cycles, each of the plurality of atomic layer deposition cycles comprising:

contacting a surface of the exposed silicon regions with a first vapor phase precursor comprising a first silicide forming metal to form a layer of first species on the surface of the substrate; and contacting the first species on the surface of the substrate with a second vapor phase precursor comprising a non-silicide forming element;

depositing a metal oxide layer over the interface layer, wherein the metal oxide layer comprises a second silicide forming metal; and forming the metal silicide beneath the interface layer, the metal silicide comprising silicon of the at least one formerly exposed silicon regions, first silicide forming metal of the interface layer and second silicide forming metal of the metal oxide layer.

15. The method of claim 14, wherein the second silicide forming metal is nickel.

16. The method of claim 14, wherein the second silicide forming metal is cobalt.

17. The method of claim 14, wherein the first silicide forming metal comprises cobalt (Co), titanium (Ti) or platinum (Pt).

18. The method of claim 14, wherein the first vapor phase precursor comprises a metal halide.

19. The method of claim 18, wherein the first vapor phase precursor comprises a metal chloride.

20. The method of claim 19, wherein the first vapor phase precursor comprises TiCl$_4$ or CoCl$_2$.

21. The method of claim 14, wherein the second vapor phase precursor comprises antimony (Sb), germanium (Ge) or tin (Sn).

22. The method of claim 21, wherein the second vapor phase precursor has a formula of Sb(SiR$^1$R$^2$R$^3$)$_3$, wherein R$^1$, R$^2$, and R$^3$ are alkyl groups.

* * * * *